US008952878B2

(12) United States Patent
Park et al.

(10) Patent No.: US 8,952,878 B2
(45) Date of Patent: Feb. 10, 2015

(54) DISPLAY DEVICE

(75) Inventors: Jae Hwa Park, Gumi-si (KR); Yeo Geon Yoon, Seoul (KR); Jang-Il Kim, Asan-si (KR); Kyung Ho Kim, Bucheon-si (KR); Jong-In Kim, Suwon-si (KR); Min-Wook Park, Asan-si (KR); Bum Ki Baek, Suwon-si (KR); Joon-Chul Goh, Hwaseong-si (KR); Young-Soo Yoon, Anyang-si (KR); Hak Bum Choi, Asan-si (KR); Hyo-Seop Kim, Cheonan-si (KR)

(73) Assignee: Samsung Display Co., Ltd. (KR)

( * ) Notice: Subject to any disclaimer, the term of this patent is extended or adjusted under 35 U.S.C. 154(b) by 211 days.

(21) Appl. No.: 13/517,872

(22) Filed: Jun. 14, 2012

(65) Prior Publication Data

US 2013/0093658 A1    Apr. 18, 2013

(30) Foreign Application Priority Data

Oct. 14, 2011  (KR) .......................... 10-2011-0105325
Oct. 18, 2011  (KR) .......................... 10-2011-0106424

(51) Int. Cl.
*G09G 3/36* (2006.01)
*G02F 1/1345* (2006.01)
*G02F 1/1362* (2006.01)

(52) U.S. Cl.
CPC .......... *G02F 1/13452* (2013.01); *G09G 3/3648* (2013.01); *G09G 3/3655* (2013.01); *G02F 1/13458* (2013.01); *G02F 1/136213* (2013.01); *G02F 1/136286* (2013.01); *G09G 2300/0426* (2013.01); *G09G 2300/0876* (2013.01); *G09G 2320/0233* (2013.01)
USPC .............................................. 345/92; 349/38

(58) Field of Classification Search
USPC ................... 257/59; 345/87, 92, 98, 139, 211
See application file for complete search history.

(56) References Cited

U.S. PATENT DOCUMENTS

| 7,084,848 | B2 * | 8/2006 | Senda et al. ..................... 345/92 |
| 7,990,504 | B2 * | 8/2011 | Lee et al. ...................... 349/141 |
| 8,031,287 | B2 * | 10/2011 | Um et al. ........................ 349/48 |
| 8,063,860 | B2 * | 11/2011 | Choi et al. ...................... 345/87 |
| 8,384,644 | B2 * | 2/2013 | Jeon ................................ 345/98 |
| 2007/0120797 | A1 * | 5/2007 | Lin et al. ......................... 345/92 |

(Continued)

FOREIGN PATENT DOCUMENTS

| JP | 2002-116425 | 4/2002 |
| JP | 3657702 | 3/2005 |

(Continued)

*Primary Examiner* — Jason Olson
(74) *Attorney, Agent, or Firm* — Innovation Counsel LLP

(57) ABSTRACT

A display device includes gate lines, data lines, first wires and second wires extending in the directions of the gate lines and data lines, and pixels having a first subpixel and a second subpixel each. The first subpixel has a first subpixel electrode and a first switching element, and the second subpixel has a second subpixel electrode and second and third switching elements. The control terminals of the three switching elements are connected to the same gate line, and the input terminals of the first and second switching elements are connected to the same data line. The first and second switching elements have output terminals connected to the first and second subpixel electrodes, respectively. The second switching element's output terminal connects to the third switching element, which has an output terminal connected to a second wire. The first wires and the second wires are connected in a pixel.

63 Claims, 30 Drawing Sheets

(56) References Cited

U.S. PATENT DOCUMENTS

| | | | |
|---|---|---|---|
| 2008/0094531 A1* | 4/2008 | Lee et al. | 349/39 |
| 2009/0027581 A1 | 1/2009 | You et al. | |
| 2009/0065778 A1 | 3/2009 | Tsubata et al. | |
| 2009/0190052 A1* | 7/2009 | Jung et al. | 349/38 |
| 2010/0085335 A1* | 4/2010 | Kato | 345/204 |
| 2010/0118220 A1* | 5/2010 | Jang et al. | 349/39 |
| 2011/0261028 A1 | 10/2011 | Goh et al. | |
| 2012/0105785 A1 | 5/2012 | Kim et al. | |

FOREIGN PATENT DOCUMENTS

| | | |
|---|---|---|
| JP | 4353660 | 8/2009 |
| JP | 2010-286628 | 12/2010 |
| KR | 10-2006-0062569 A | 6/2006 |
| KR | 10-2006-0075054 A | 7/2006 |
| KR | 10-2006-0075063 A | 7/2006 |
| KR | 10-0712118 | 4/2007 |
| KR | 10-2008-0050691 A | 6/2008 |
| KR | 10-0851743 | 8/2008 |
| KR | 10-2009-0038775 A | 4/2009 |

* cited by examiner

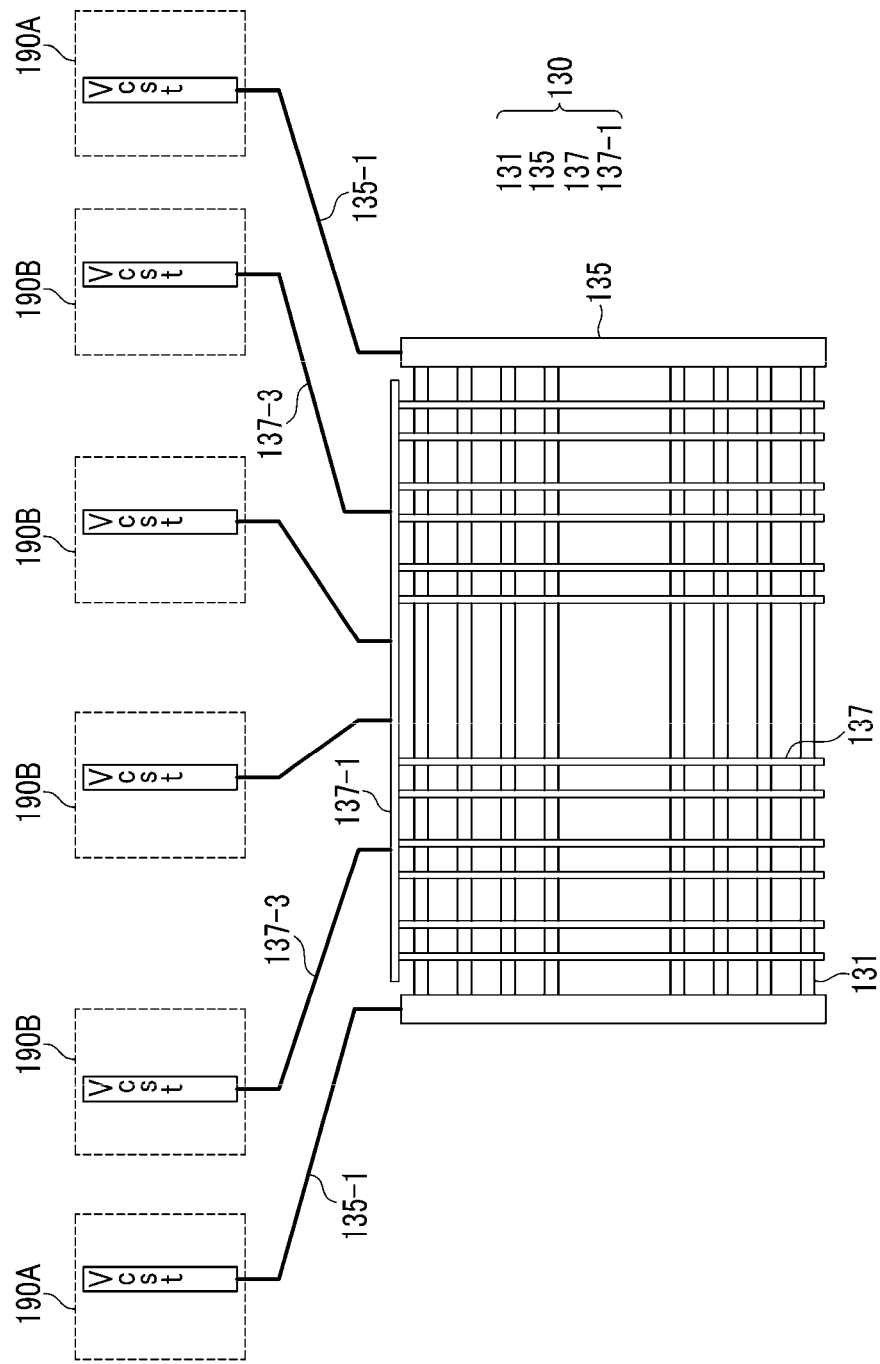

DISPLAY DEVICE

CROSS-REFERENCE TO RELATED APPLICATION

This application claims priority to and the benefit of Korean Patent Application No. 10-2011-0105325 filed in the Korean Intellectual Property Office on Oct. 14, 2011 and Patent Application No. 10-2011-0106424 filed in the Korean Intellectual Property Office on Oct. 18, 2011, the entire contents of which are incorporated herein by reference.

BACKGROUND

1. Technical Field

The present invention relates generally to a display device, and particularly to a display device having a voltage commonly applied to each pixel through wiring.

2. Description of the Related Art

Currently, flat panel displays are widely used as display devices for various applications. Flat panel displays are generally classified into liquid crystal display, organic light emitting device, electrophoretic display, plasma display device, and micro-shutter display device.

Among them, liquid crystal display panel, which is one of the more common types of flat panel displays currently in use, comprises two sheets of substrates with field generating electrodes such as a pixel electrode and a common electrode, and a liquid crystal layer interposed therebetween. The liquid crystal display generates electric fields in the liquid crystal layer by applying voltages to the field generating electrodes, thereby determining the alignment of liquid crystal molecules in the liquid crystal layer and controlling polarization of incident light.

A storage capacitor receives a storage voltage to maintain liquid crystal molecules aligned by the electric field for a predetermined time period (one frame).

Also, according to a pixel structure of the liquid crystal display, one pixel is divided into at least two subpixels, and an element such as a transistor connected to the storage voltage may be used to apply different electric fields between the liquid crystal layers of the subpixels.

As described above, when a constant voltage such as the storage voltage is applied to each pixel through a wiring, the magnitude of the storage voltage varies according to the position of the pixel.

Also, in the liquid crystal display, in addition to the wiring (storage voltage line) transmitting the storage voltage, a gate line and a data line intersect each other such that the storage voltage line may intersect one of the wirings or partially overlap one of the wirings. In this case, a gate voltage signal or a data voltage signal applied to each pixel may be delayed.

The data voltage is changed every horizontal period 1H. However, the data voltage may be delayed by wiring, an electrode formed near the wiring, or an electrode formed on an opposing substrate.

Further, the aperture ratio or transmittance may be reduced by addition of separate wiring.

In addition, when forming a color filter in a lower panel, the cell gap is decreased at a position where the gate line and the data line cross such that a layer formed at the position where the gate line and the data line cross may be easily shorted to a common electrode of an upper panel.

This may be generated in other flat panel displays as well as the liquid crystal display, even if a storage voltage is not used, and the same problem may be generated in the case of a voltage (for example, a common voltage, a reference voltage, etc.) that is equally applied to a plurality of pixels through the wiring.

Meanwhile, among the liquid crystal displays, a vertically aligned mode liquid crystal display in which a long axis of the liquid crystal molecules are arranged to be perpendicular to a display panel in the state in which an electric field is not applied has been in the limelight due to a high contrast ratio and a wide reference viewing angle thereof. However, the vertically aligned mode liquid crystal display may not provide the same display quality when viewed from a side as when viewed from the front. In order to solve the problem, one pixel is partitioned into two subpixels and voltages of the two subpixels are adjusted to be different from each other to change transmittance. In this liquid crystal display, when differently controlling the voltages of the two subpixels, the voltage that is commonly applied inside the liquid crystal display may be changed.

The above information disclosed in this Background section is only for enhancement of understanding of the background of the invention and therefore it may contain information that does not form the prior art that is already known in this country to a person of ordinary skill in the art.

SUMMARY

In one aspect, the invention provides a display device in which a constant voltage is applied without regard to a position of a pixel when each pixel is applied with a voltage through wiring.

In another aspect, the invention is a display device in which delay in data voltage transmission due to wiring transmitting the constant voltage to each pixel is prevented.

In yet another aspect, the invention is a display device in which a delay of the data voltage due to wiring or an electrode formed neighboring to the data line or formed in an opposed substrate is prevented.

In yet another aspect, the invention is a display device in which a reduction of an aperture ratio and a transmittance due to a separate wiring is prevented.

In yet another aspect, a display device in which a short with a common electrode of an upper panel at a position where a gate line and a data line are crossed is prevented even though a color filter is formed in a lower panel.

In yet another aspect, the present invention prevents a change of a voltage commonly applied inside a liquid crystal display.

In yet another aspect, a display device according to the invention includes: a plurality of gate lines; a plurality of data lines; a plurality of first wires extending in a direction of the gate lines; a plurality of second wires extending in a direction of the data lines; and a plurality of pixels. One pixel includes a first subpixel having a first subpixel electrode and a first switching element, and a second subpixel having a second subpixel electrode, a second switching element, and a third switching element. The first switching element includes a first control terminal connected to one of the plurality of gate lines, a first put terminal connected to one of the plurality of data lines, and a first output terminal connected to the first subpixel electrode. The second switching element includes a second control terminal connected to the same gate line as the first switching element, a second input terminal connected to the same data line as the first switching element, and a third output terminal connected to the second subpixel electrode. The third switching element includes a third control terminal connected to the same gate line as the first switching element, a third input terminal connected to the output terminal of the second switching element, and a third output terminal connected to one of the plurality of second wires. The plurality of first wires and the plurality of second wires are electrically connected to each other in at least one of the plurality of pixels.

One of the plurality of the first wires and one of the plurality of second wires may be electrically connected to each other at a protrusion of the first wires.

The first wire may be a main storage voltage line, the second wire may be an assistant storage voltage line, and the first wire and the second wire may be supplied with a storage voltage.

A plurality of main storage voltage lines may be connected by a pair of storage voltage bars, and a plurality of assistant storage voltage lines may be connected by at least one assistant storage voltage bar.

A pair of storage voltage bars may be positioned at respective ends of the plurality of main storage voltage lines, and at least one assistant storage voltage bar may be connected to a plurality of assistant storage voltage lines of a portion formed at a left side, while tone of the pair of storage voltage bars may be connected to a plurality of assistant storage voltage lines formed at a right side.

The pair of storage voltage bars and the at least one assistant storage voltage bar may receive the storage voltage from a pad portion of a data driver.

The pad portion of the data driver applying the storage voltage to the pair of storage voltage bars and the at least one assistant storage voltage bar may include two pad portions formed at a leftmost side and two pad portion formed at a rightmost side.

A plurality of the second wires may overlap the pixel electrode.

The first subpixel electrode and the second subpixel electrode may respectively include a transverse stem, a longitudinal stem, and minute branches, and the assistant storage voltage line may include a portion formed according to the longitudinal stem.

The assistant storage voltage lines may include a first assistant storage voltage line and a second assistant storage voltage line, the first assistant storage voltage line may include a portion overlapping the longitudinal stem of the first subpixel electrode and a portion extending toward a protrusion of the main storage voltage line, and the second assistant storage voltage line may include a portion overlapping the longitudinal stem of the second subpixel electrode and a portion connected to the third switching element.

At least one of the first assistant storage voltage line and the second assistant storage voltage line may include a portion overlapping the transverse stem.

The second assistant storage voltage line may be connected to a third drain electrode of the third switching element.

The second assistant storage voltage line and the third drain electrode may extend to the protrusion of the main storage voltage line, and the first assistant storage voltage line, the second assistant storage voltage line, and the main storage voltage line may be electrically connected to each other at the protrusion of the main storage voltage line.

The first assistant storage voltage line and the second assistant storage voltage line may be directly connected at the protrusion of the main storage voltage line and formed with the same material.

The display device may further include a shielding electrode line formed according to the data line.

The assistant storage voltage lines may be divided into a first assistant storage voltage line and a second assistant storage voltage line, and the first assistant storage voltage line and the second assistant storage voltage line may be connected by a storage electrode connecting member.

The second wire may be a shielding electrode line overlapping the data line and extending in the direction of the data line, and the shielding electrode line may include a first portion that expands while being bent in the transistor region, an extension extending from the first portion without overlapping with the data line, and a connection curving toward the data line.

One pixel further may include a transistor region between the first subpixel and the second subpixel, and the shielding electrode line may include a first portion extending toward the transistor region, an extension extending from the first portion without overlapping with the data line, and a connection curved toward the data line.

The first portion may be electrically connected to the main storage voltage line through a contact hole.

The main storage voltage line may include a first storage electrode and a second storage electrode, and a protrusion of the first storage electrode and a protrusion of the second storage electrode may be connected by a storage electrode connecting member.

The first storage electrode may be formed in the first subpixel, the second storage electrode may be formed in the second subpixel, the main storage voltage line may be connected directly to the first storage electrode, and the second storage electrode may be connected to the main storage voltage line through the storage electrode connecting member or the first storage electrode.

The storage electrode connecting member may only be formed in one of a plurality of neighboring pixels.

As described above, the display device according to the present invention may apply a constant voltage without regard to the position of the pixel when applying the voltage to each pixel through the wires.

In yet another aspect, the invention is a liquid crystal display that includes: a first substrate including a display area and a peripheral area enclosing the display area; two storage voltage bars respectively positioned in the peripheral area at both sides of the display area; a plurality of gate lines formed on the first substrate; a plurality of main storage electrode lines positioned on the first substrate and connected to the two storage voltage bars; a plurality of data lines positioned on the first substrate and intersecting the gate lines; a plurality of pixels connected to the plurality of gate lines and the plurality of data lines; and an assistant storage voltage line electrically connected to the main storage electrode line, wherein each pixel includes a first thin film transistor and a second thin film transistor connected to a gate line and a data line, a third thin film transistor connected to a gate line, a second thin film transistor, and a main storage electrode line, and a pixel electrode including a first subpixel electrode connected to the first thin film transistor and a second subpixel electrode connected to the second thin film transistor.

A plurality of assistant storage voltage lines may be formed and may be connected to the main storage electrode line through a third thin film transistor in each pixel.

Each assistant storage voltage line may be positioned on a data line.

The display device may further include a storage voltage transmitting line positioned in the peripheral area and applying a storage voltage to the storage voltage bar, wherein the width of the storage voltage bar may be gradually increased from an edge connected to the storage voltage transmitting line to an edge facing the edge connected to the storage voltage transmitting line.

The storage voltage bar may be applied with a first storage voltage and a second storage voltage that is equal to or larger than the first storage voltage.

There may be multiple assistant storage voltage lines, and they may be positioned at ¼, ½, and ¾ of a distance between two storage voltage bars.

The assistant storage voltage line may be positioned at a ½ position of an interval between the two storage voltage bars.

The magnitude of the voltage applied to the assistant storage voltage line may be equal to or larger than the magnitude of the voltage applied to the main storage electrode line.

The main storage electrode line may include a protrusion overlapping one terminal of the third thin film transistor, and the assistant storage voltage line may include a connecting member extending toward the protrusion of the main storage electrode line.

The connecting member may be connected to one terminal of the third thin film transistor.

The output terminal of the second thin film transistor may be connected to the second subpixel electrode and the input terminal of the third thin film transistor.

The voltage applied to the second subpixel electrode may be lower than the voltage applied to the first subpixel electrode.

The area of the second subpixel electrode may be equal to or larger than the area of the first subpixel electrode.

The first subpixel electrode and the second subpixel electrode may include a cross stem including a transverse stem and a longitudinal stem intersecting thereto, and a plurality of minute branches extending from the cross stem.

The gate line may transmit a gate signal, and the gate signal applied to each control terminal of the first thin film transistor, the second thin film transistor, and the third thin film transistor may be simultaneously transmitted.

In yet another aspect, the invention is a liquid crystal display that includes: a first substrate including a display area and a peripheral area enclosing the display area; two storage voltage bars respectively positioned in the peripheral area at both sides of the display area; a gate line positioned on the first substrate; a main storage electrode line positioned on the first substrate and connected to the two storage voltage bars; a data line positioned on the first substrate and intersecting the gate line; a first thin film transistor and a second thin film transistor connected to the gate line and the data line; a third thin film transistor connected to the gate line, the second thin film transistor, and the main storage electrode line; a pixel electrode including a first subpixel electrode connected to the first thin film transistor and a second subpixel electrode connected to the second thin film transistor; and a storage voltage transmitting line positioned in the peripheral area and applying a storage voltage to the storage voltage bar, wherein the width of the storage voltage bar increases in going from a first end connected to the storage voltage transmitting line to a second end connected to the storage voltage transmitting line.

In yet another aspect, the invention is a liquid crystal display that includes: a first substrate including a display area and a peripheral area enclosing the display area; two storage voltage bars respectively positioned in the peripheral area at both sides of the display area; a gate line positioned on the first substrate; a main storage electrode lines positioned on the first substrate and connected to two storage voltage bars; a data line positioned on the first substrate and intersecting the gate line; a first thin film transistor and a second thin film transistor connected to the gate line and the data line; a third thin film transistor connected to the gate line, the second thin film transistor, and the main storage electrode line; and a pixel electrode including a first subpixel electrode connected to the first thin film transistor and a second subpixel electrode connected to the second thin film transistor, wherein the storage voltage bar is applied with the first storage voltage and the second storage voltage.

The magnitude of the second storage voltage may be equal to or larger than the magnitude of the first storage voltage.

The display device may further include a first storage voltage transmitting line applying the first storage voltage to the storage voltage bar, and a second storage voltage transmitting line applying the second storage voltage to the storage voltage bar.

The storage voltage bar may include a first end that is connected to the first storage voltage transmitting line and a second end that is connected to the second storage voltage transmitting line.

As described above, according to an exemplary embodiment of the present invention, delay in the transmission of the data voltage is not generated by the wiring transmitting the constant voltage to each pixel.

Further, the data voltage is not delayed by the wiring or the electrode that is close to the data line and is formed on the opposite substrate.

Also, the aperture ratio and the transmittance are not reduced by the formation of the additional wiring.

In yet another aspect, the invention is a display device where three assistant storage voltage lines or one assistant storage voltage line receiving an assistant voltage that is equal to or larger than the storage voltage applied to the storage voltage bar are formed, preventing a change of the storage voltage inside the liquid crystal display.

The assistant storage voltage line connected to the main storage electrode line is formed on the data line such that the change of the storage voltage inside the liquid crystal display may be prevented.

The width of the storage voltage bar increases in going from a first end that is connected to the first storage voltage transmitting line to the second end such that the change of the storage voltage inside the liquid crystal display may be prevented.

Further, two storage voltages having different magnitudes are applied to the different edges of the storage voltage bar such that the change of the storage voltage inside the liquid crystal display may be prevented.

BRIEF DESCRIPTION OF THE DRAWINGS

FIG. 2A to FIG. 2C are views of a structure of a storage voltage line, an application position of a storage voltage, and a pad portion of an IC in a display device according to an exemplary embodiment of the present invention.

DETAILED DESCRIPTION OF THE EMBODIMENTS

Figure 1:
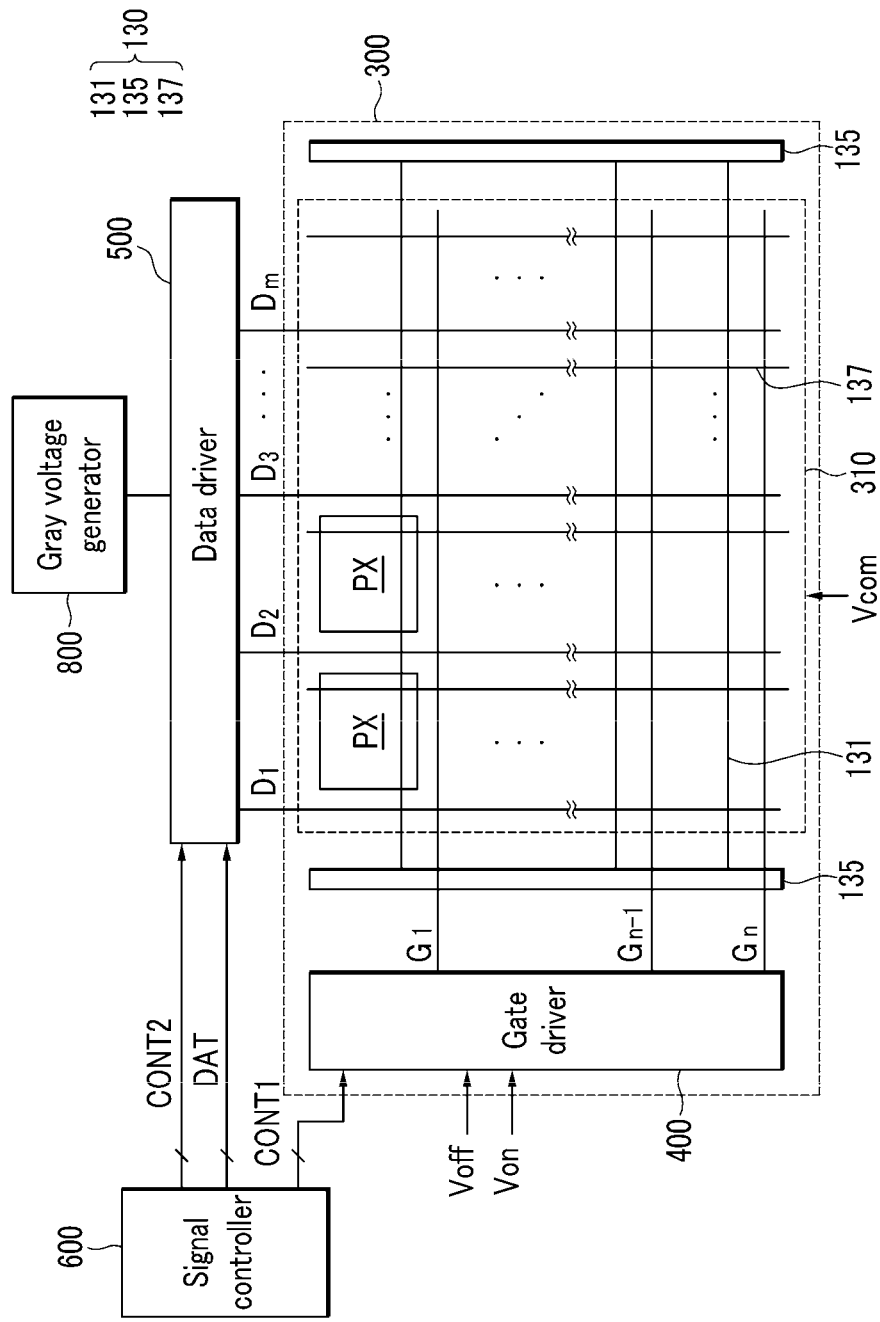
FIG. 1 is a block diagram of a display device according to an exemplary embodiment of the present invention.

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may be present. In contrast, when an element is referred to as being "directly on" another element, there are no intervening elements present.

Now, a display device according to an exemplary embodiment of the present invention will be described with reference to FIG. 1 and FIG. 2.

Figure 2B:
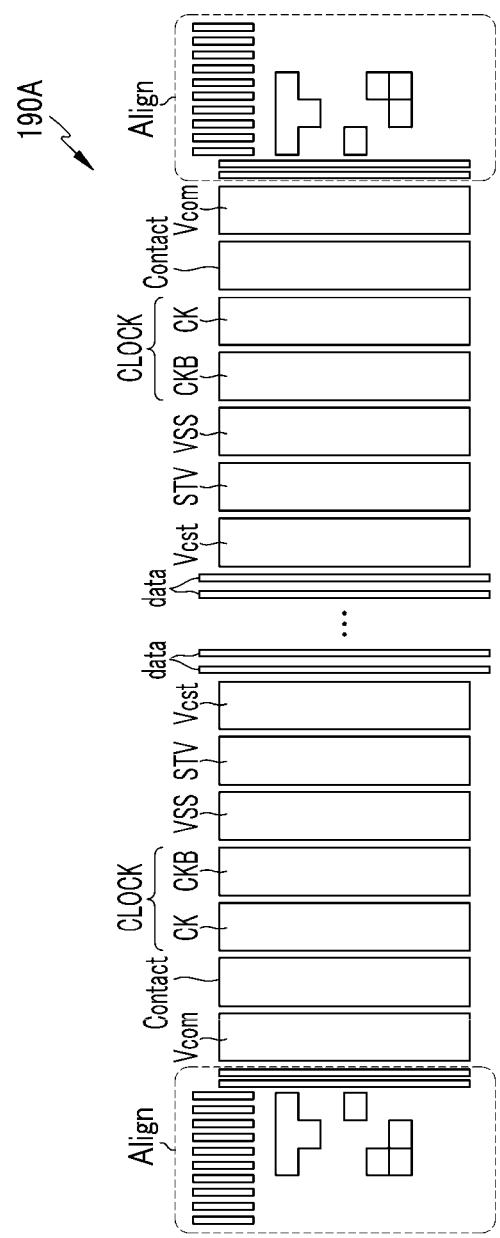
Figure 2C:
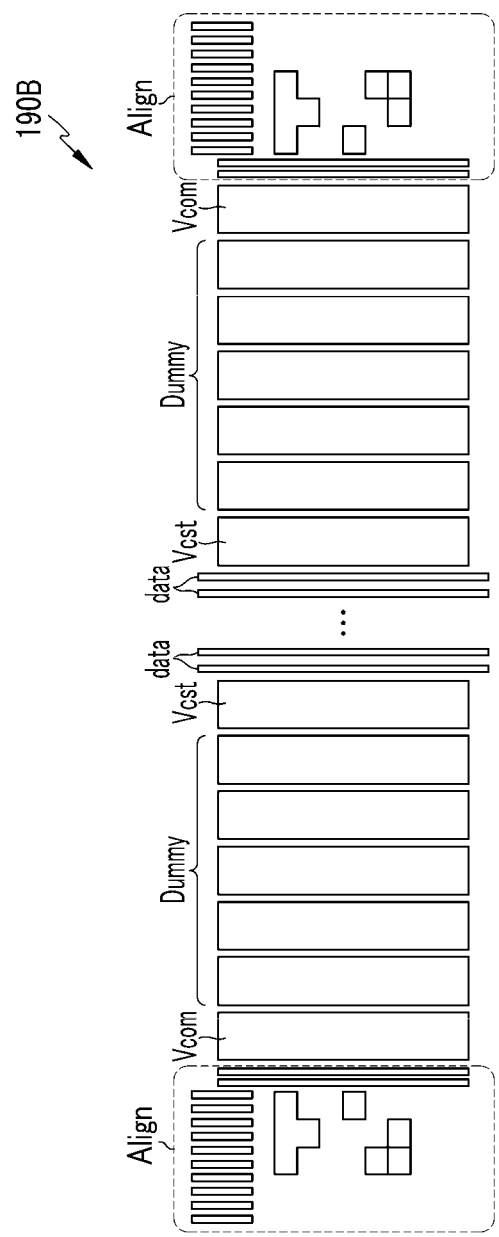

FIG. 1 is a block diagram of a display device according to an exemplary embodiment of the present invention, and FIG. 2A to FIG. 2C are views of a structure of a storage voltage line, an application position of a storage voltage, and a pad portion of an IC in a display device according to an exemplary embodiment of the present invention.

As shown in FIG. 1, a display device according to an exemplary embodiment of the present invention includes a display panel assembly 300, a gate driver 400 and a data driver 500 connected thereto, a gray voltage generator 800 connected to the data driver 500, and a signal controller 600 controlling them.

The display panel assembly 300 includes a plurality of signal lines G1 to Gn and D1 to Dm and a plurality of pixels PX connected thereto and arranged substantially in a matrix. Each pixel PX may have various structures according to the kind of display device, and includes a switching element connected to one of a plurality of gate lines G1-Gn and one of a plurality of data lines D1-Dm.

The signal lines G1 to Gn and D1 to Dm include a plurality of gate lines G1 to Gn transferring a gate signal (also referred to as a "scan signal") and a plurality of data lines D1 to Dm transferring a data voltage. The gate lines G1 to Gn extend substantially in a row direction and are substantially parallel to each other, and the data lines D1 to Dm extend substantially in a column direction and are substantially parallel to each other.

The display panel assembly 300 includes a plurality of wires (referred to as storage voltage lines 130 in the present exemplary embodiment) transmitting a voltage (referred to as a storage voltage in the present exemplary embodiment) commonly applied to a plurality of pixels PX. Each storage voltage line 130 includes a plurality of main storage voltage lines 131 extending in a direction of the plurality of gate lines G1-Gn and a plurality of assistant storage voltage lines 137 extending in a direction of the plurality of data lines D1-Dm. The storage voltage lines 130 transverse each pixel PX, and each pixel PX receives the storage voltage from a storage voltage line 130. In each pixel PX, one of a plurality of main storage voltage lines 131 and one of a plurality of assistant storage voltage lines 137 are electrically connected to each other.

A structure of the storage voltage line 130 and an application method of the storage voltage are shown in FIG. 2A in detail.

Firstly, the structure of the storage voltage line 130 will be described. The storage voltage line 130 includes the main storage voltage line 131, the assistant storage voltage line 137, a storage voltage bar 135, and an assistant storage voltage bar 137-1.

The main storage voltage line 131 and the assistant storage voltage line 137 intersect each other in each pixel PX, and are electrically connected to each other in each pixel PX.

The storage voltage bar 135 connects a plurality of main storage voltage lines 131 extending in the direction of the gate lines G1-Gn and extends in the direction of the data lines D1-Dm. The storage voltage bar 135 is formed as a pair at a right side and a left side of the display area 310. That is, a pair of storage voltage bars 135 are respectively positioned at both ends of the main storage voltage line 131.

The assistant storage voltage bar 137-1 connects a plurality of assistant storage voltage lines 137 extending in the direction of the data lines D1-Dm and extends in the direction of the gate lines G1-Gn. One assistant storage voltage bar 137-1 is formed at an upper side of the display area 310, but it may be formed at a lower side according to the exemplary embodiment, and a pair of assistant storage voltage bars 137-1 separated from each other may be formed at the upper side or the lower side. When forming the assistant storage voltage bars in a pair, one of them may be connected to one assistant storage voltage line 137 formed at the left side of the display area 310, and the other may be connected to the other assistant storage voltage lines 137 formed at the right side of the display area 310. Also, according to the exemplary embodiment, a number of assistant storage voltage lines 137 connected to a pair of assistant storage voltage bars 137-1 may be the same.

The above storage voltage line 130 is applied with a storage voltage Vcst, and referring to FIG. 2A, is formed to be applied through a portion of a pad portion of the data driver 500. In FIG. 2A, the pad portion 190 of the data driver 500 is divided into portions 190A and 190B. The arrangement structure of the pad may be changed according to the position of the pad portion 190, and A and B are added to divide the arrangement structure as in FIG. 2B and FIG. 2C.

The data driver 500 includes a plurality of ICs, and each IC includes the pad portion 190 to be connected to wiring of the display panel assembly 300. In FIG. 2A, a total of six pad portions 190 of a plurality of ICs of the data driver 500 are shown, and the number thereof may be changed according to an exemplary embodiment. The pad portions of the two ICs formed at the leftmost side and the rightmost side are indicated by 190A and may have different structures from the other pad portions (indicated by 190B). This will be described later in reference to FIG. 2B and FIG. 2C.

Firstly, a structure transmitting the storage voltage Vcst through the pad portions 190A of two ICs formed at the leftmost side and the rightmost side will be described.

The pad portions 190A of the two ICs formed at the leftmost side and the rightmost side apply the storage voltage Vcst to the storage voltage bar 135 through each Vcst pad. That is, the Vcst pad of the pad portion 190A positioned at the leftmost side applies the storage voltage Vcst to the storage voltage bar 135 positioned at the leftmost side through the first storage voltage transmitting line 135-1, and the Vcst pad of the pad portion 190A positioned at the rightmost side applies the storage voltage Vcst to the storage voltage bar 135 positioned at the rightmost side through the first storage voltage transmitting line 135-1.

On the other hand, the other pad portions 190B apply the storage voltage Vcst to one assistant storage voltage bar 137-1 through each Vcst pad. That is, a plurality of Vcst pads apply the storage voltage Vcst at each position of one assistant storage voltage bar 137-1 through the second storage voltage transmitting line 137-3 that is respectively connected. The assistant storage voltage bar 137-1 receives a plurality of storage voltages Vcst to maintain the constant storage voltage Vcst.

On the other hand, FIG. 2B and FIG. 2C show the pad portions 190A and 190B according to an exemplary embodiment of the present invention in detail.

For the pad portions 190 of a plurality of ICs of the data driver 500, the pad portions 190A of two ICs formed at the leftmost side and the rightmost side transmit the same signal, and the pad portions 190B of the other ICs transmit the same signal.

Firstly, as shown in FIG. 2B, the pad portions 190A of two ICs formed at the leftmost side and the rightmost side will be described.

In the pad portion 190A, control signal application pads Vcom, Contact, CLOCK, VSS, STV, and Vcst and alignment marks Align that are arranged in symmetry with respect to pad portions data transmitting the data voltage are formed.

Here, the Vcom pad is a pad for applying the common voltage, the Contact pad is a pad that is used to measure contact resistance and may not be applied with a separate signal during ordinary times, the CLOCK pads (the CK pad and the CKB pad) are pads for applying a clock signal used in the gate driver 400, the VSS pad is a pad for applying a low voltage used in the gate driver 400, and the STV pad is a pad for applying a start signal of the gate driver 400. Meanwhile, the Vcst pad as the pad for applying the storage voltage applies the storage voltage to one storage voltage bar 135 through the first storage voltage transmitting line 135-1 as shown in FIG. 2A.

In the exemplary embodiment of FIG. 2B, the pad portion 190A of the IC positioned at the leftmost side has two Vcst pads, thereby two pads for applying the storage voltage exist. In the above-described exemplary embodiment, the second Vcst pad from the left side may apply the storage voltage to one storage voltage bar 135 through the first storage voltage transmitting line 135-1, or may apply the storage voltage to the assistant storage voltage bar 137-1 through the second storage voltage transmitting line 137-3.

Also, according to an exemplary embodiment, a dummy pad may be formed between the CLOCK pad, the VSS pad, STV pad, the Vcst pad, and the data pad, thereby performing a function of preventing signal interference between the neighboring pads.

Further, according to an exemplary embodiment, the Vcom pad, the Contact pad, the CK pad, the CKB pad, and the VSS pad may be made of at least one pad. Here, the Vcom pad and the VSS pad may be made of at least two pads applying voltages having different levels, and the CK pad and the CKB pad may be made of at least two pads having different phases.

In FIG. 2B, the Vcom pad, the Contact pad, the CK pad, the CKB pad, the VSS pad, the STV pad, and the Vcst pad have the same width. However, they may have different widths according to an exemplary embodiment. The width of the pad may be changed according to the level or the characteristics of the voltage applied to each pad. Also, according to an exemplary embodiment, the width of the pad portion data transmitting the data voltage may be the same as one among the control signal application pads Vcom, Contact, CLOCK, VSS, STV, and Vcst.

In the present exemplary embodiment, the signals (a clock signal, a low voltage, a start signal etc.) used in the gate driver 400 are applied in the pad portion 190A of the IC formed at the rightmost side, and this is an exemplary embodiment in which the gate driver 400 is also formed at the right side of the display panel 300, differently from the exemplary embodiment of FIG. 1.

Meanwhile, in the pad portion 190B shown in FIG. 2C, a plurality of data pads transmitting the data voltage in the IC of the data driver 500 are formed, and the storage voltage Vcst, the common voltage Vcom, and the alignment marks are additionally formed. As shown in FIG. 2A, the Vcst pad transmitting the storage voltage Vcst applies the storage voltage Vcst to each position of one assistant storage voltage bar 137-1 through the second storage voltage transmitting line 137-3.

In FIG. 2B and FIG. 2C, a portion between the data pads is omitted and a total of four data pads are shown. However, the IC is mainly formed to apply the data voltage to the data line such that most of the pads are data pads.

Also, according to an exemplary embodiment, the Vcom pad may be made of at least one pad. Here, the Vcom pad may be made of two or more pads applying voltages of different levels.

In FIG. 2C, the Vcom pad, the Dummy pad, and the Vcst pad all have the same width. However, they may have different widths according to an exemplary embodiment. Here, the width of the pad may be changed according to the level or the characteristics of the voltage applied to each pad. Also, according to an exemplary embodiment, one of the Vcom pad and the Dummy pad may have the same width as the pad portion data transmitting the data voltage.

Also, in FIG. 2B and FIG. 2C, the structure that is shown has a left-right symmetry. However, the pad portion may not have the right and left symmetry structure according to an exemplary embodiment, and in this case, the signal applied to the left side and the signal applied to the right side may be different inside the pad portion.

As described above, the storage voltage Vcst is transmitted to the main storage voltage line 131 through the storage voltage bar 135, and then is applied to the pixel PX, also is transmitted to the assistant storage voltage line 137 through the assistant storage voltage bar 137-1 and then is applied to the pixel PX. Also, the main storage voltage line 131 and the assistant storage voltage line 137 are electrically connected to each other in each pixel PX. Therefore, the magnitude of the storage voltage Vcst applied to each pixel PX may be uniform.

In FIG. 2A to FIG. 2C, the main storage voltage line 131 and the assistant storage voltage line 137 have one line shape, but this is only schematically shown, and the voltage lines 131 and 137 may have a bent structure according to an exemplary embodiment.

Also, the structure of the pad portion 190 applying the storage voltage Vcst to the main storage voltage line 131 and the assistant storage voltage line 137 may be changed, differently from FIGS. 2A-C.

Again referring to FIG. 1, other constituent elements of the display device will be described.

The gray voltage generator 800 receives the driving voltage AVDD to generate gray voltage groups (reference gray voltage groups) of two sets related to the transmittance of the pixel PX. One of two sets has a positive value and the other has a negative value with respect to the common voltage Vcom.

The gate driver 400 may be integrated with the display panel assembly 300, and is connected to the gate lines G1-Gn of the display panel assembly 300 to apply a gate signal made of a combination of a gate-on voltage Von and a gate-off voltage Voff to the gate lines G1-Gn.

The data driver 500 is connected with the data lines D1 to Dm of the display panel assembly 300, and selects a gray voltage from the gray voltage generator 800 and applies the selected gray voltage to the data lines D1 to Dm as the data signal. However, when the gray voltage generator 800 provides a defined number of the reference gray voltages that is fewer than all the voltages for all the grays, the data driver 500 divides the reference gray voltages to generate the gray voltages for all the grays and selects the data signal among the generated gray voltages.

The signal controller 600 controls the gate driver 400, the data driver 500, etc. The signal controller 600 receives input image signals R, G, and B and an input control signal to control the display of the image signals R, G, and B from a graphics controller (not shown). Examples of the input control signals may include a vertical synchronization signal Vsync, a horizontal synchronizing signal Hsync, a main clock signal MCLK, a data enable signal DE, and the like.

The signal controller 600 appropriately processes the input image signals R, G, and B in accordance with an operating condition of the display panel assembly 300 based on the input image signals R, G, and B and the input control signals, generates a gate control signal CONT1, a data control signal CONT2, and the like, and then transmits the gate control signal CONT1 to the gate driver 400 and transmits the data control signal CONT2 and a processed image signal DAT to the data driver 500.

The gate control signal CONT1 includes a scanning start signal STV to instruct of the start of image scanning, and at least one clock signal to control an output cycle of the gate-on voltage. The gate control signal CONT1 may further include an output enable signal OE to define the duration of the gate-on voltage.

The data control signal CONT2 includes a horizontal synchronization start signal STH informing of the transmission start of digital image data DAT for one column of pixels PX, a load signal LOAD to instruct the analog data voltage to be applied to the image data lines D1-Dm, and a data clock signal HCLK. The data control signal CONT2 may further include an inversion signal RVS that inverts the voltage polarity of the data voltage for the common voltage Vcom. Hereinafter, the data signal polarity denotes the voltage polarity of the data signal for the common voltage.

According to the data control signal CONT2 from the signal controller 600, the data driver 500 receives the digital image signals DAT for the pixels PX of one row and selects the gray voltage corresponding to each digital image signal DAT, to thereby convert the digital image signal DAT into an analog data signal and then apply the converted analog data signal to the corresponding data lines D1-Dm.

The gate driver 400 applies the gate-on voltage Von to gate lines G1-Gn according to the gate control signal CONT1 from the signal controller 600 to turn on the switching element Q connected to the gate lines G1-Gn. Then, the data signal applied to the data lines D1-Dm is applied to the corresponding pixel PX through the turned-on switching element Q.

Each of the driving circuits 500, 600, and 800 excluding the gate driver 400 may be directly mounted on the display panel assembly 300 in the form of at least one integrated circuit or an IC chip, may be mounted on a flexible printed circuit film (not shown) to be attached to the display panel assembly 300, or may be mounted on a separate printed circuit board (not shown). Alternatively, the driving circuits 500, 600, and 800 may be integrated with the liquid crystal panel assembly 300 together with, for example, the signal lines G1-Gn and D1-Dm and the thin film transistor switching element Q.

In the above, it is premised that the pixel PX has various structures. To explain a structure of the pixel PX in detail, a case where the display device is a liquid crystal display will be described as an exemplary embodiment.

Figure 3:
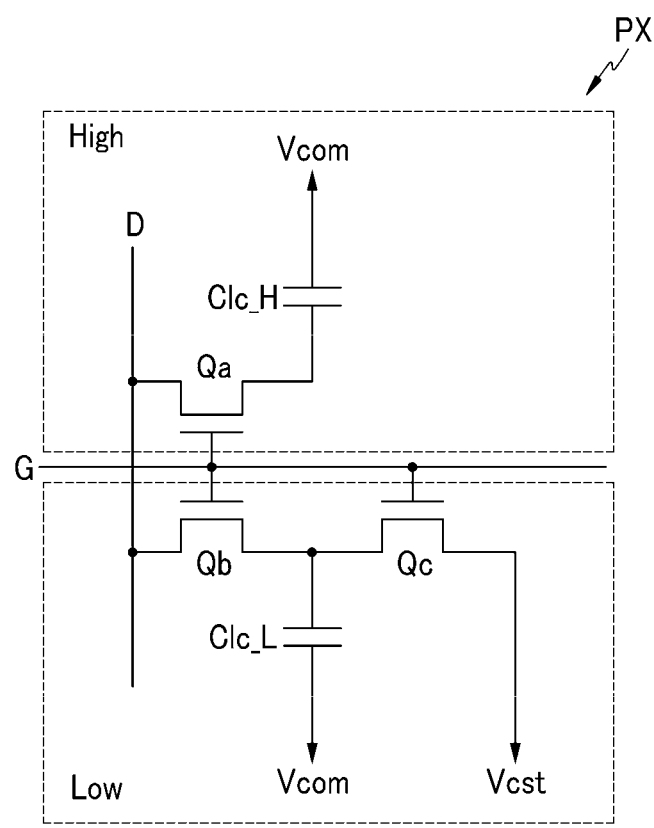
FIG. 3 is an equivalent circuit diagram of a pixel structure of a display device according to an exemplary embodiment of the present invention.

FIG. 3 is an equivalent circuit diagram of a pixel structure of a display device according to an exemplary embodiment of the present invention.

Referring to FIG. 3, a liquid crystal display according to an exemplary embodiment of the present invention includes a signal line including a gate line G transmitting a gate signal and a data line D transmitting a data signal, and a pixel PX connected thereto.

The pixel PX includes the first, second, and third switching elements Qa, Qb, and Qc and first and second liquid crystal capacitors Clc_H and Clc_L. The pixel PX is divided into a high gray subpixel High (referred to as the "first subpixel") and a low gray subpixel Low (referred to as the "second subpixel"), the high gray subpixel High includes the first switching element Qa and the first liquid crystal capacitor Clc_H, and the low gray subpixel Low includes the second and the third switching elements Qb and Qc and the second liquid crystal capacitor Clc_L. Here, the first, second, and third switching elements Qa, Qb, and Qc may be three-terminal elements such as thin film transistors.

The first switching element Qa and the second switching element Qb are respectively connected to the gate line G and the data line D, and the third switching element Qc is connected to the gate line G and the output terminal of the second switching element Qb.

The first switching element Qa and the second switching element Qb include the control terminal connected to the gate line G and the input terminal connected to the data line D, the first switching element Qa includes the output terminal connected to the first liquid crystal capacitor Clc_H, and the second switching element Qb includes the output terminal connected to the input terminal connected to the second liquid crystal capacitor Clc_L and the third switching element Qc.

The third switching element Qc includes the control terminal connected to the gate line G, the input terminal connected to the second liquid crystal capacitor Clc_L, and the output terminal connected to the storage voltage line 130 to receive the storage voltage Vcst.

If the gate line G is applied with the gate on voltage Von, the first switching element Qa, the second switching element Qb, and the third switching element Qc connected thereto are turned on. Accordingly, the data voltage applied to the data line D is applied to the first subpixel electrode and the second subpixel electrode as one terminal of the first liquid crystal capacitor Clc_H and the second liquid crystal capacitor Clc_L through the first switching element Qa and the second switching element Qb that are turned on. However, as the third switching element Qc is turned on, the voltage applied to the second subpixel electrode is divided according to a voltage difference between the storage voltage Vcst and the input data voltage and the resistance of the third switching element Qc. The divided voltage is applied to the second subpixel electrode and the second liquid crystal capacitor Clc_L is charged according to the divided voltage. That is, the voltage applied to the second subpixel electrode is smaller than the voltage applied to the first subpixel electrode, and the voltage charged to the first liquid crystal capacitor Clc_H and the voltage charged to the second liquid crystal capacitor Clc_L are different. The voltage charged to the first liquid crystal capacitor Clc_H and the voltage charged to the second liquid crystal capacitor Clc_L are different such that the alignment directions of the liquid crystal molecules are different in the first subpixel and the second subpixel, and thereby the luminance displayed in the two subpixels is different. That is, when representing a front luminance to be displayed by combining the luminance displayed by two subpixels, lateral display quality is improved due to various liquid crystal alignments in the lateral direction.

The pixel PX of the liquid crystal display like FIG. 3 has different magnitudes of kickback voltages of the first subpixel and the second subpixel. Therefore, the value of the common voltage Vcom considering the kickback voltage is different in each subpixel. However, the pixel has the structure in which the same data voltage and the common voltage Vcom are applied such that a display defect such as a flicker and an afterimage due to the different kickback voltages may be generated. However, in the structure like in FIG. 3, if the storage voltage Vcst is increased, the difference between the kickback voltages of the first subpixel and the second subpixel is decreased such that the flicker or the afterimage may be removed.

This will be described through Table 1 to Table 3 below.

TABLE 1

| | Vcst voltage | | | | |
|---|---|---|---|---|---|
| | 8 V | 9 V | 10 V | 11 V | 12 V |
| Transmittance | 6.11% | 6.23% | 6.36% | 6.46% | 6.45% |

Firstly, Table 1 shows the increase of the transmittance of the second subpixel as the storage voltage Vcst is increased. However, if the storage voltage Vcst reaches 11V, the transmittance may be saturated and is not further increased. Here, the transmittance reflects a relative increase in the rate for the transmittance of the second subpixel in a special exemplary embodiment.

TABLE 2

| | Vcst voltage | | | | |
|---|---|---|---|---|---|
| | 4 V | 6 V | 8 V | 10 V | 12 V |
| Level difference | 3.0 | 2.3 | 1.6 | 1.0 | 0.7 |

Here, the level difference represents a difference between the common voltages Vcom according to the kickback voltages in the first subpixel and the second subpixel.

Table 2 shows that the level difference is decreased according to the increase of the storage voltage Vcst, and the difference of the common voltage Vcom is decreased such that the flicker or the afterimage is not generated.

Table 3 shows a relation between the flicker and the storage voltage Vcst.

TABLE 3

| Vcst voltage | Flicker degree |
|---|---|
| 8 V | 16 |
| 9 V | 14.3 |
| 10 V | 12.6 |
| 11 V | 11.1 |
| 12 V | 9 |
| 13 V | 7.4 |
| 14 V | 5.3 |
| 15 V | 4 |

According to Table 1 to Table 3, when the storage voltage Vcst is high, the degree of flicker is low. However, a storage voltage Vcst in the range of 9 to 15V at which the transmittance is improved may be used. The common voltage Vcom may be 7V.

The constant storage voltage Vcst must be applied such that the voltage charged to the second liquid crystal capacitor Clc_L of the low gray subpixel Low is appropriately divided and charged. Therefore, to apply the constant storage voltage Vcst, it is necessary to use the structure of the storage voltage line 130 as in FIG. 1 and FIG. 2.

Firstly, a pixel structure of a display device according to an exemplary embodiment of the present invention will be described with reference to FIG. 4 to FIG. 6.

Figure 4:
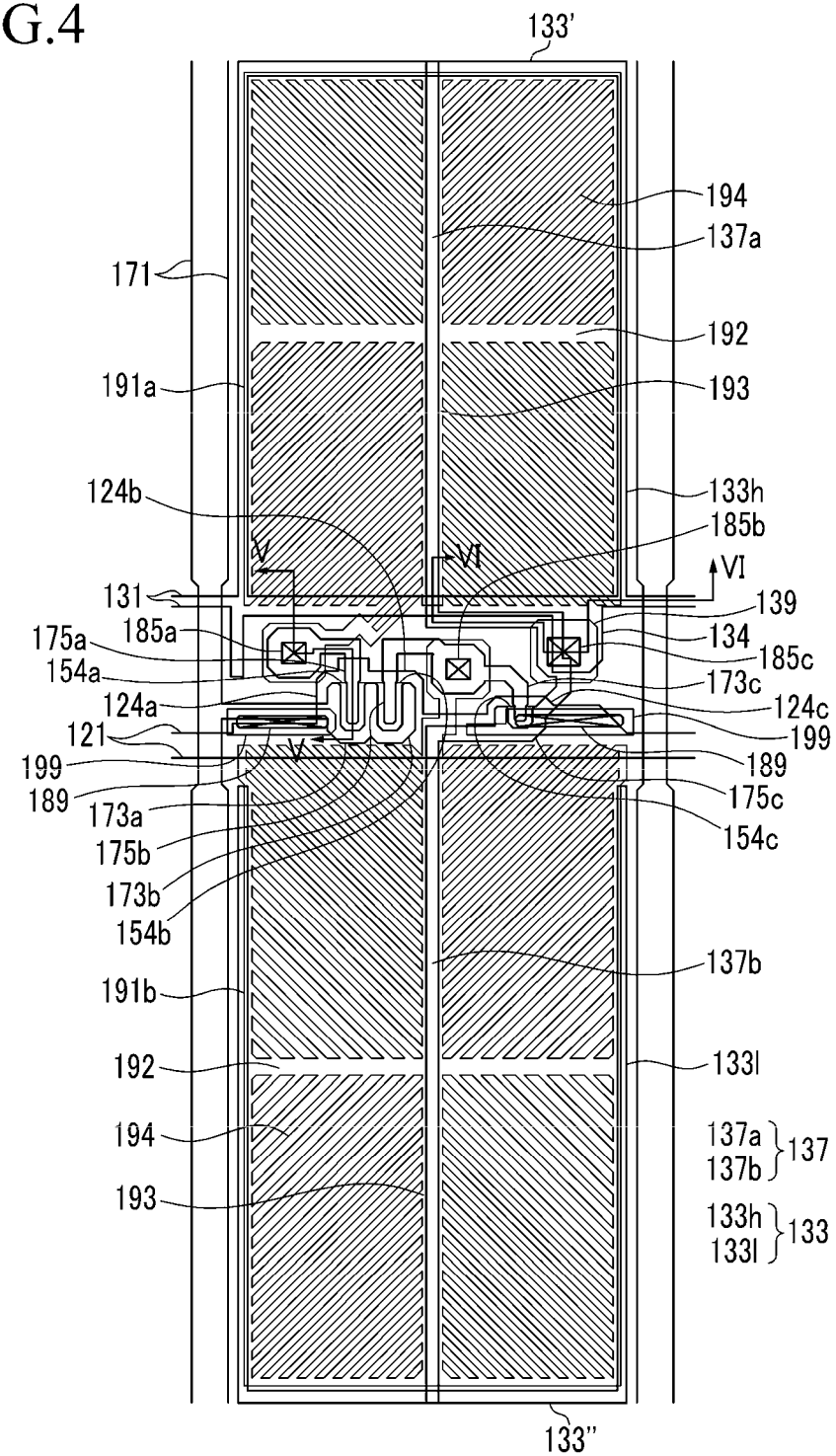
FIG. 4 is a layout view of one pixel of a display device according to an exemplary embodiment of the present invention.
Figure 5:
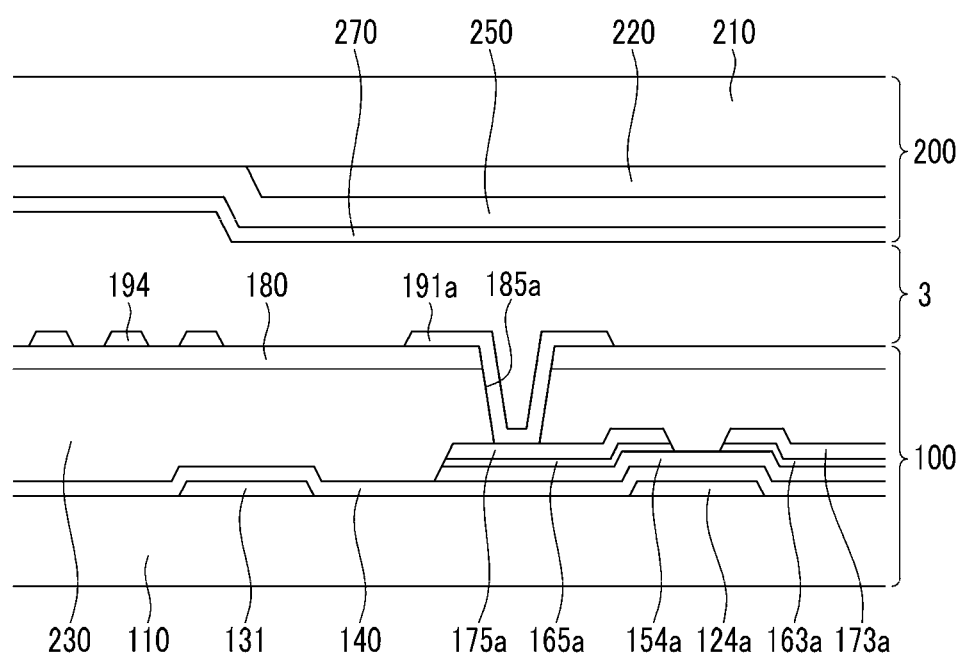
FIG. 5 is a cross-sectional view taken along the line V-V of FIG. 4.
Figure 6:
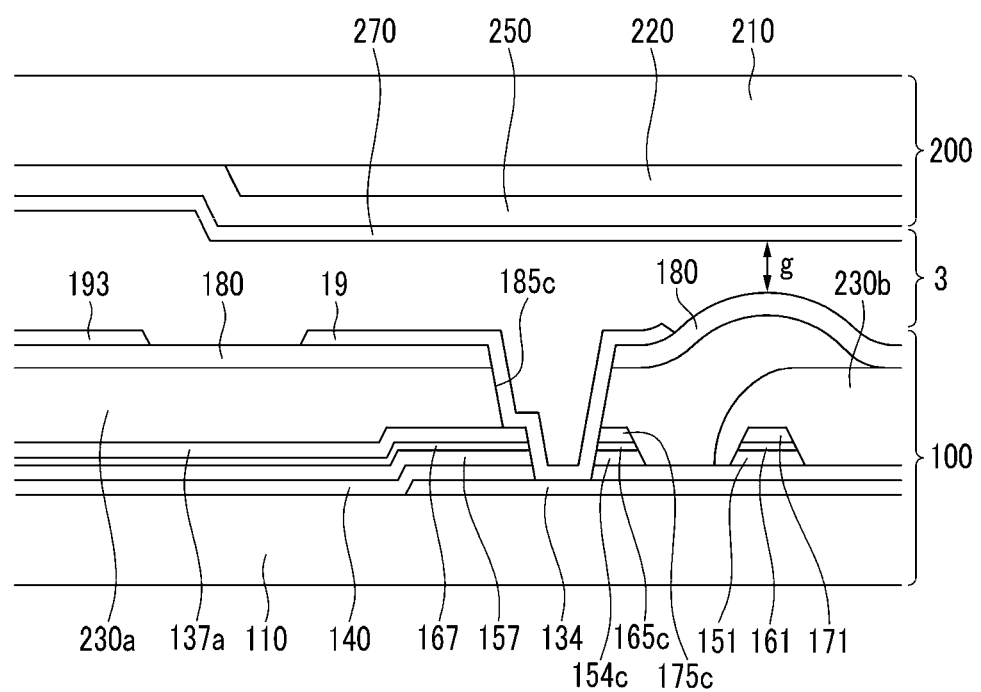
FIG. 6 is a cross-sectional view taken along the line VI-VI of FIG. 4.

FIG. 4 is a layout view of one pixel of a display device according to an exemplary embodiment of the present invention, FIG. 5 is a cross-sectional view taken along the line V-V of FIG. 4, and FIG. 6 is a cross-sectional view taken along with the line VI-VI of FIG. 4.

A liquid crystal display according to the present exemplary embodiment includes a lower panel 100 and an upper panel 200 facing each other, a liquid crystal layer 3 interposed between the two display panels 100 and 200, and a pair of polarizers (not shown) attached to outer surfaces of the display panels 100 and 200.

Firstly, the lower panel 100 will be described.

A gate line 121 and a main storage voltage line 131 are formed on an insulation substrate 110 made of transparent glass or plastic. The gate line 121 includes a first gate electrode 124*a*, a second gate electrode 124*b*, and a third gate electrode 124c. The main storage voltage line 131 includes a storage electrode 133 and a protrusion 134 protruding in a direction of the gate line 121. The storage electrode 133 includes a first storage electrode 133h enclosing a first subpixel electrode 191a and a second storage electrode 133l enclosing a second subpixel electrode 191b of a previous pixel. Although the previous pixel is not shown in FIG. 4, a horizontal portion 133' of the first storage electrode 133h of FIG. 4 and a horizontal portion 133" of the second storage electrode 133l of the previous pixel are connected to each other by continuous wiring.

A gate insulating layer 140 is formed on the gate line 121 and the main storage voltage line 131. A first semiconductor 154a, a second semiconductor 154b, and a third semiconductor 154c are formed on the gate insulating layer 140.

A plurality of ohmic contacts are formed on the first semiconductor 154a, the second semiconductor 154b, and the third semiconductor 154c. Only ohmic contacts 163a and 165a formed on the first semiconductor 154a are shown in FIG. 5, and only an ohmic contact 165c formed on the third semiconductor 154c is shown in FIG. 6. This is because cutting lines of the drawing do not transverse the other portions.

Data conductors 171, 173c, 175a, 175b, and 175c including a plurality of data lines 171 including a first source electrode 173a and a second source electrode 173b, a first drain electrode 175a, a second drain electrode 175b, a third source electrode 173c, and a third drain electrode 175c are formed on the ohmic contacts 163a, 165a, and 165c and the gate insulating layer 140. Also, an assistant storage voltage line 137 is formed on the ohmic contacts 163a and 165a and the gate insulating layer 140, and the assistant storage voltage line 137 includes a first assistant storage voltage line 137a and a second assistant storage voltage line 137b. Referring to FIG. 6, a semiconductor layer (151 and 157) and an ohmic contact (161 and 167) are positioned under the data line 171 and the assistant storage voltage line 137.

The first assistant storage voltage line 137a includes a portion overlapping a longitudinal stem 193 of the first subpixel electrode 191a and a portion extending toward a protrusion 134 of the main storage voltage line 131 to be bent.

Also, the second assistant storage voltage line 137b includes a portion overlapping the longitudinal stem 193 of the second subpixel electrode 191b and a portion connected to the third drain electrode 175c to be bent. The connected second assistant storage voltage line 137b and the third drain electrode 175c extend to the protrusion 134 of the main storage voltage line 131.

The width of the portion where the first assistant storage voltage line 137a and the second assistant storage voltage line 137b respectively overlap the longitudinal stem 193 of the first subpixel electrode 191a and the longitudinal stem 193 of the second subpixel electrode 191b is narrower than the width of the longitudinal stem 193. It may vary according to an exemplary embodiment; however, in the present exemplary embodiment, the width of a region where the first assistant storage voltage line 137a and the second assistant storage voltage line 137b overlap the longitudinal stem 193 ("the overlapping portion") is formed to be 3 μm, and the longitudinal stem 193 is formed to be 7 μm, and thereby the longitudinal stem 193 has a width of more than double the overlapping portion.

The first assistant storage voltage line 137a, the second assistant storage voltage line 137b, and the main storage voltage line 131 are electrically connected to each other on the protrusion 134 of the main storage voltage line 131, and are directly connected in the exemplary embodiment in FIG. 4. However, according to an exemplary embodiment, they may be connected by a storage electrode connecting member 139 that will be described later.

Also, the first assistant storage voltage line 137a and the second assistant storage voltage line 137b of the previous pixel PX are electrically connected to each other, and the second assistant storage voltage line 137b and the first assistant storage voltage line 137a of a next pixel PX are electrically connected to each other. In the present exemplary embodiment, they are directly connected, and formed with the same layer and the same material.

The first gate electrode 124a, the first source electrode 173a, and the first drain electrode 175a form the first thin film transistor Qa along with the first semiconductor 154a, and a channel of the thin film transistor is formed in the semiconductor portion 154a between the first source electrode 173a and the first drain electrode 175a. Similarly, the second gate electrode 124b, the second source electrode 173b, and the second drain electrode 175b form the second thin film transistor Qb along with the second semiconductor 154b, and the channel of the thin film transistor is formed in the semiconductor portion 154b between the second source electrode 173b and the second drain electrode 175b, and the third gate electrode 124c, the third source electrode 173c, and the third drain electrode 175c form the third thin film transistor Qc along with the third semiconductor 154c, and the channel of the thin film transistor is formed in the semiconductor portion 154c between the third source electrode 173c and the third drain electrode 175c.

A color filter 230 and a passivation layer 180 are formed on the data conductors 171, 173c, 175a, 175b, and 175c and the exposed semiconductors 154a, 154b, and 154c. The color filter 230 may display one of three primary colors such as red, green, and blue. However, it is not limited to the three primary colors such as red, green, and blue, and may display one of cyan, magenta, yellow, and white-based colors. The color filter 230 may be made of a material that displays different colors every neighboring pixel, and in FIG. 6, two color filters are differently indicated by 230a and 230b to display the different colors. Also, in FIG. 6, a cell gap is decreased at a region (on the data line 171) where the neighboring color filters 230a and 230b overlap such that the cell gap has an interval g. The interval g may be about half of the total cell gap.

On the other hand, the passivation layer 180 is made of an inorganic insulator such as silicon nitride and silicon oxide or an organic insulator.

The color filter 230 and the passivation layer 180 have a first contact hole 185a and a second contact hole 185b exposing the first drain electrode 175a and the second drain electrode 175b. Also, the color filter 230 and the passivation layer 180 have a third contact hole 185c exposing the protrusion 134 of the main storage voltage line 131, the third drain electrode 175c, and the first assistant storage voltage line 137a. Also, the passivation layer 180 has an opening 189 gathering a gas emitted from the color filter 230. According to FIG. 4, one pixel may include a pair of openings 189.

A pixel electrode 191 including the first subpixel electrode 191a and the second subpixel electrode 191b and a storage electrode connecting member 139 are formed on the passivation layer 180. Also, a cover 199 covering the opening 189 may be formed on the opening 189 of the passivation layer 180. The cover 199 prevents the gas emitted from the color filter 230 from reaching other elements, and one pixel has a pair of covers 199 in FIG. 4. The pixel electrode 191, the cover 199, and the storage electrode connecting member 139 may be made of a transparent conductive material such as ITO or IZO.

The first subpixel electrode 191a and the second subpixel electrode 191b neighbor each other in the column direction and the overall shape thereof is quadrangular, and includes a cross stem having a transverse stem 192 and a longitudinal stem 193 intersecting thereto. The first and second sub-pixel electrodes 191a and 191b are divided into four sub-regions by the transverse stem 192 and the longitudinal stem 193, and each of the sub-regions includes a plurality of minute branches 194.

The minute branches 194 of the first subpixel electrode 191a and the second subpixel electrode 191b form an angle of about 40 degrees to 45 degrees with the gate line 121 or the transverse stem 192. Particularly, the minute branches 194 included in the first subpixel electrode 191a may form an angle of about 40 degrees with the transverse stem 192, and the minute branches 194 included in the second subpixel electrode 191b may form an angle of about 45 degrees with the transverse stem 192. Also, the minute branches 194 of the two neighboring subregions may extend in intersecting directions. Further, the width of the minute branches 194 may gradually widen or the interval between the minute branches 194 may be changed.

The first subpixel electrode 191a and the second subpixel electrode 191b are physically and electrically connected to the first drain electrode 175a and the second drain electrode 175b through the contact holes 185a and 185b, respectively, and receive the data voltage from the first drain electrode 175a and the second drain electrode 175b, respectively. In this case, a part of the data voltage applied to the second drain electrode 175b is divided through the third source electrode 173c such that the magnitude of the voltage applied to the second subpixel electrode 191b may be smaller than that of the voltage applied to the first subpixel electrode 191a. An area of the second subpixel electrode 191b may be approximately one to two times larger than that of the first subpixel electrode 191a.

On the other hand, the storage electrode connecting member 139 connects the protrusion 134 of the main storage voltage line 131, the third drain electrode 175c, and the first assistant storage voltage line 137a to each other through the contact hole 185c. The protrusion 134 of the main storage voltage line 131 and the first assistant storage voltage line 137a are applied with the storage voltage Vcst such that the storage voltage Vcst has a constant voltage value, and the third thin film transistor Qc is applied with the storage voltage Vcst through the third drain electrode 175c. As a result, the voltage applied to the second subpixel may be decreased.

Next, the upper panel 200 will be described.

A light blocking member 220 is formed on an insulation substrate 210 made of transparent glass or plastic. The light blocking member 220 is referred to as a black matrix and prevents light leakage.

An overcoat 250 is formed on the substrate 210 and the light blocking member 220. The overcoat 250 may be made of an insulating material, and it may be omitted.

A common electrode 270 is formed on the overcoat 250.

Alignment layers (not shown) are formed on both surfaces of the display panels 100 and 200, and they may be vertical alignment layers.

Polarizers (not shown) are formed on the outer surface of the display panels 100 and 200, the polarization axis of the two polarizers are crossed, and one polarization axis thereof may be parallel to the gate lines 121.

The first subpixel electrode 191a and the second subpixel electrode 191b applied with the data voltage generate an electric field together with the common electrode 270 of the upper panel 200 that receives the common voltage, to thereby determine a direction of liquid crystal molecules of the liquid crystal layer 3 between the electrodes 191a and 191b, and 270. Polarization of light that transmits through the liquid crystal layer 3 differs depending on the determined direction of the liquid crystal molecules.

In the exemplary embodiment of FIG. 4, the assistant storage voltage line 137 transmitting the storage voltage is not formed with the same layer as the pixel electrodes 191a and 191b, but is formed with the same layer as the data line 171 that is closer to the substrate 110. Therefore, although the storage voltage Vcst is high, the interval from the common electrode 270 is long such that the interference is not generated. Therefore, in the exemplary embodiment of FIG. 4, the high voltage among the various storage voltages Vcst used in Table 1 to Table 3 may be used, and a voltage of more than 11V at which the transmittance is saturated is used as the storage voltage Vcst in the exemplary embodiment of FIG. 4. At this time, the voltage of 7V is used as the common voltage Vcom.

Next, whether the aperture ratio and transmittance are decreased by overlapping the assistant storage voltage line 137 and the longitudinal stem 193 of the subpixel electrodes 191a and 191b will be described with reference to FIG. 7 and FIG. 8.

Figure 7:
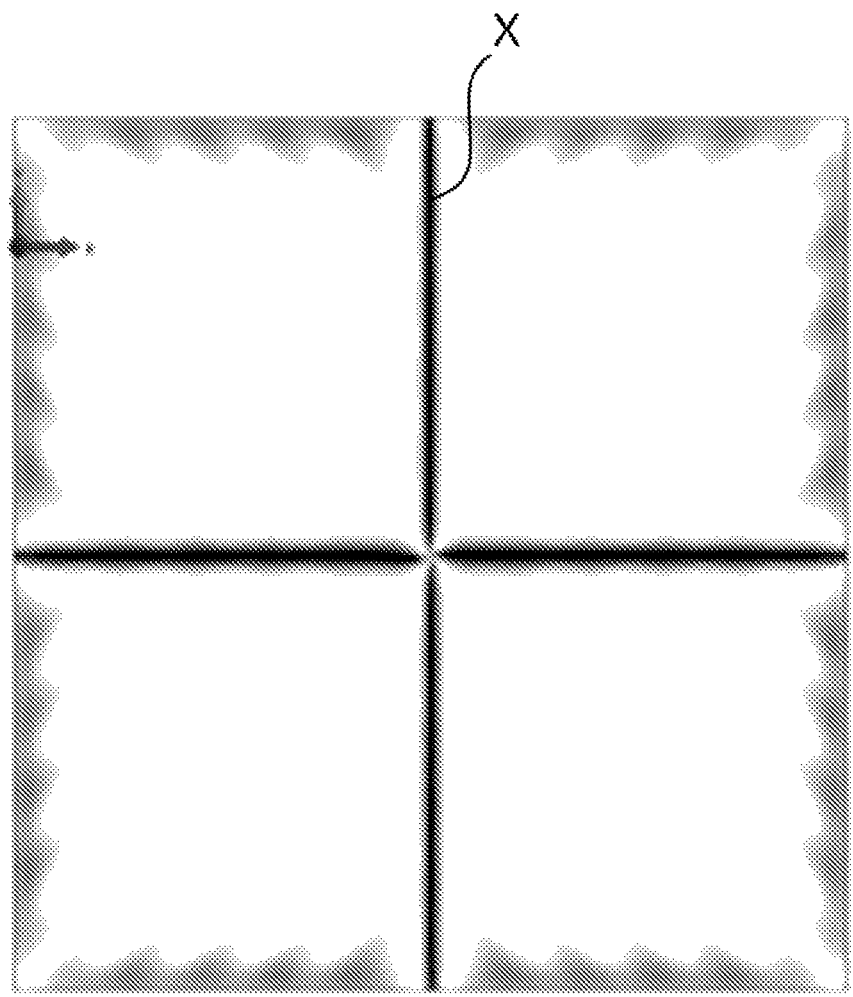
FIG. 7 and FIG. 8 are a view and a graph showing a simulation result of transmittance for a portion of a pixel of FIG. 4.
Figure 8:
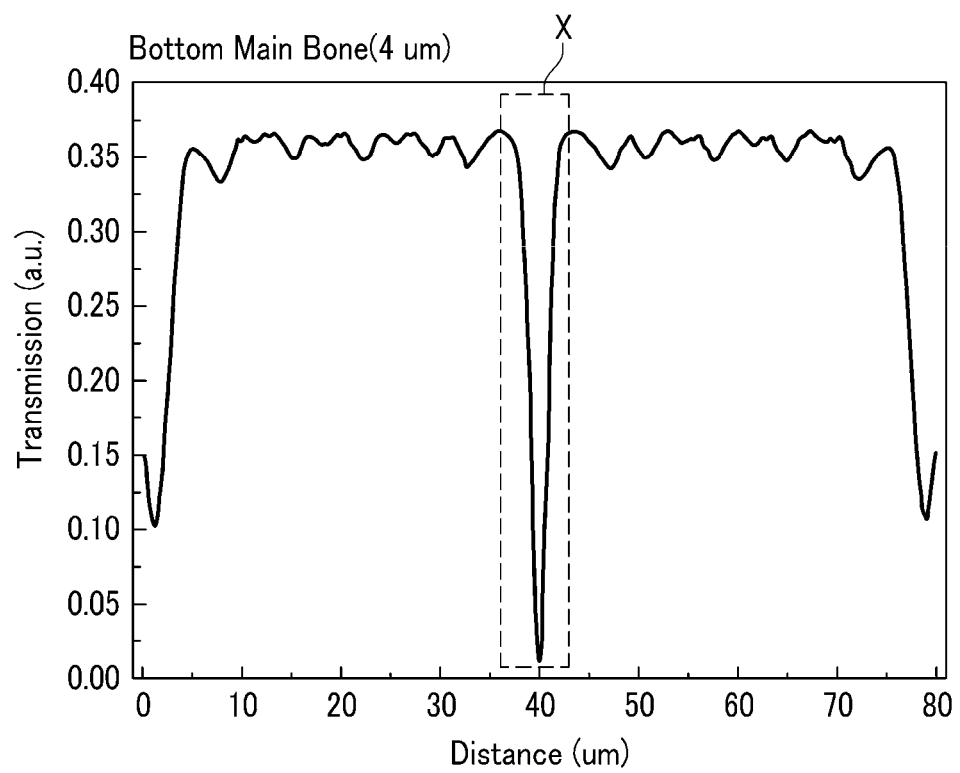

FIG. 7 and FIG. 8 are a view and a graph showing a simulation result of transmittance for a portion of the pixel of FIG. 4.

Firstly, FIG. 7 is a view simulating transmittance of the first subpixel in the exemplary embodiment of FIG. 4. As shown in FIG. 7, in the first subpixel, a portion corresponding to the transverse and the longitudinal stems 192 and 193 is a portion where light is not originally transmitted (referring to a portion X) such that it may be confirmed that the transmittance and the aperture ratio are not decreased even though the assistant storage voltage line 137 is formed.

Also, FIG. 8 shows a simulation result of FIG. 7 as a transmittance graph for a position in the portion corresponding to the portion X of FIG. 7, and shows that the transmittance is quickly decreased and little light is transmitted such that the transmittance is not decreased even though the assistant storage voltage line 137 is formed, and the aperture ratio is not decreased.

Deterioration of the aperture ratio and the transmittance by the assistant storage voltage line 137 of the present invention will be described based on the results of FIG. 7 and FIG. 8.

The first assistant storage voltage line 137a and the second assistant storage voltage line 137b that are connected to each other respectively overlap the longitudinal stem 193 of the first subpixel electrode 191a and the longitudinal stem 193 of the second subpixel electrode 191b on most of the region, and the remaining portion is positioned at the center portion of the pixel that is covered by the light blocking member 220 such that they do not decreases the aperture ratio. Particularly, the portion of the longitudinal stem 193 of the subpixel electrode 191a and 191b is the portion where the light is not transmitted like the portion X of FIG. 7 and FIG. 8, such that the reduction of the aperture ratio and transmittance is not generated even though the assistant storage voltage line 137 is formed through this portion.

Therefore, like the exemplary embodiment of FIG. 4, each pixel may be applied with the constant storage voltage Vcst through the formation of the assistant storage voltage line 137 according to the longitudinal stem 193 of the subpixel electrodes 191a and 191b, and thereby the reduction of the aperture ratio and the transmittance may not be generated.

Also, the assistant storage voltage line 137 is substantially parallel to and does not overlap the data line 171 such that the data voltage transmitted to the data line 171 is not delayed.

Next, another exemplary embodiment of the present invention will be described with reference to FIG. 9 to FIG. 12.

FIG. 9 to FIG. 12 are layout views of one pixel of a display device according to another exemplary embodiment of the present invention.

Firstly, an exemplary embodiment of FIG. 9 will be described.

Figure 9:
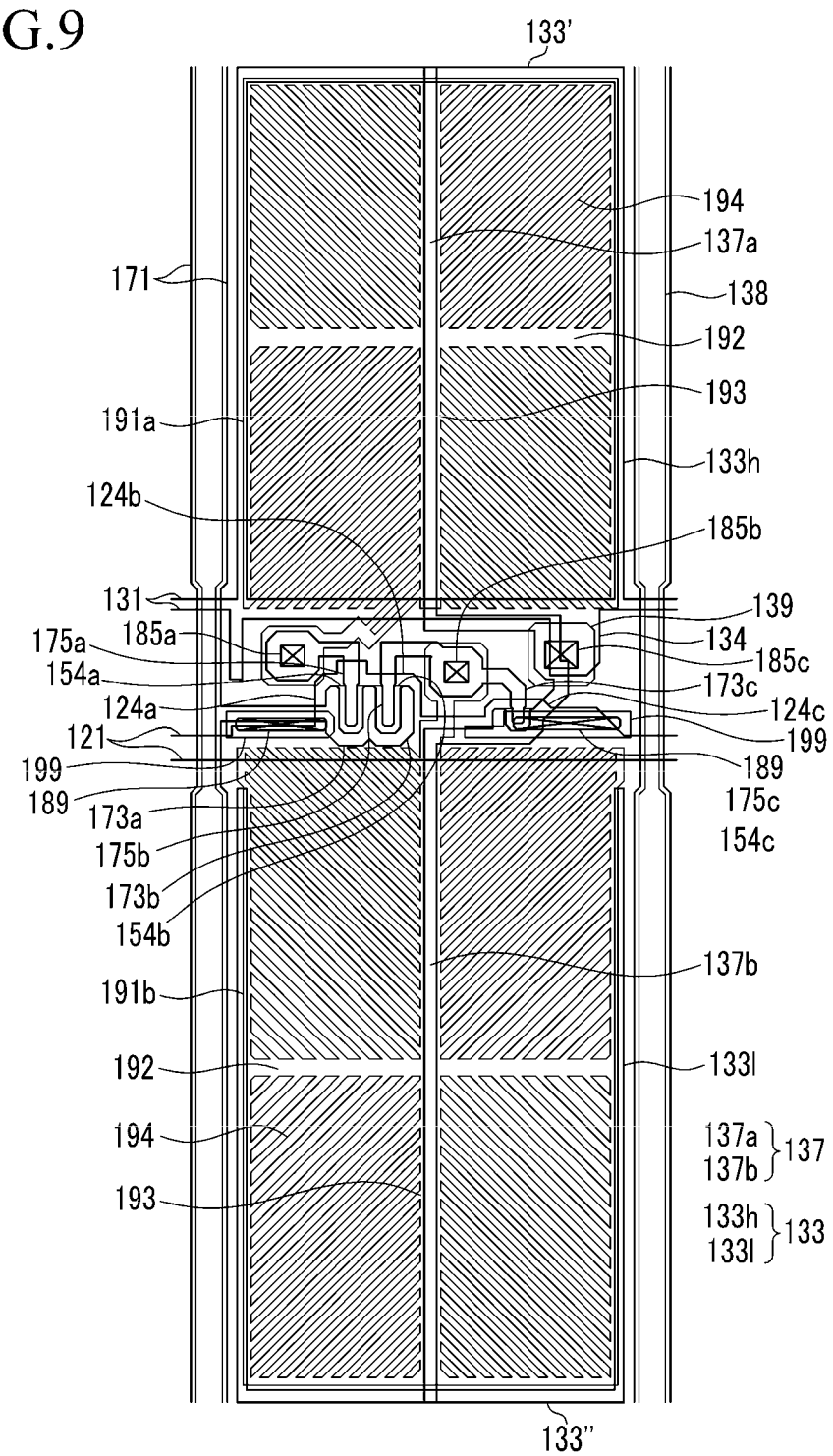
FIG. 9 to FIG. 12 are layout views of one pixel of a display device according to another exemplary embodiment of the present invention.

The exemplary embodiment of FIG. 9 further includes an additional shielding electrode line 138 compared to the exemplary embodiment of FIG. 4. The shielding electrode line 138 overlaps the data line 171, and it has a structure such that its width is reduced along the data line 171 in a region between the first subpixel and the second subpixel (hereinafter referred to as a "transistor region"). The width of the shielding electrode line 138 may be narrower than the width of the data line 171. The shielding electrode line 138 prevents the data voltage transmitted to the data line 171 from being delayed by the capacitance along with the common electrode 270 of the upper panel 200 by being positioned therebetween.

That is, in the exemplary embodiment of FIG. 9, the data voltage of the data line 171 is not delayed by the common electrode 270 of the upper panel 200.

An exemplary embodiment of FIG. 10 will be described below.

Figure 10:
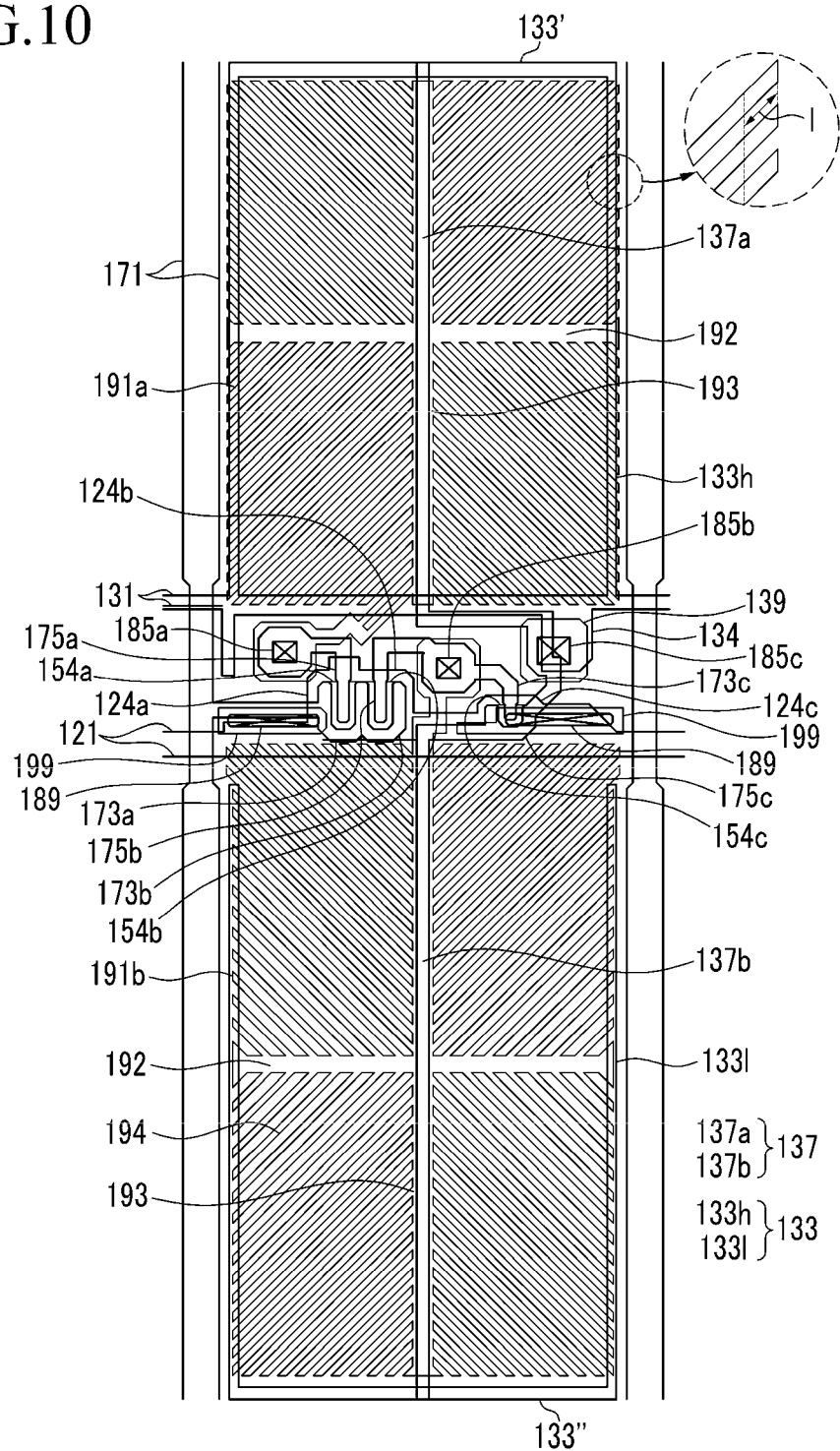

The exemplary embodiment of FIG. 10 differs from the exemplary embodiment of FIG. 4 in that the length of the minute branches 194 of the first subpixel electrode 191a and the second subpixel electrode 191b is elongated by a value 1. That is, the length of the minute branches 194 extends across the subpixel electrodes 191a and 191b such that the region of the liquid crystal layer that may be controlled by the electric field is widened and the side of the subpixel is increased. This way, an increased aperture ratio is achieved compared to the embodiment of FIG. 4. The minute branches 194 may extend near the data line 171 and may overlap the data line 171 according to an exemplary embodiment.

Meanwhile, in the exemplary embodiment of FIG. 9, the shielding electrode line 138 is formed on the data line 171 such as to limit the length of the minute branches 194.

Now, an exemplary embodiment of FIG. 11 will be described.

Figure 11:
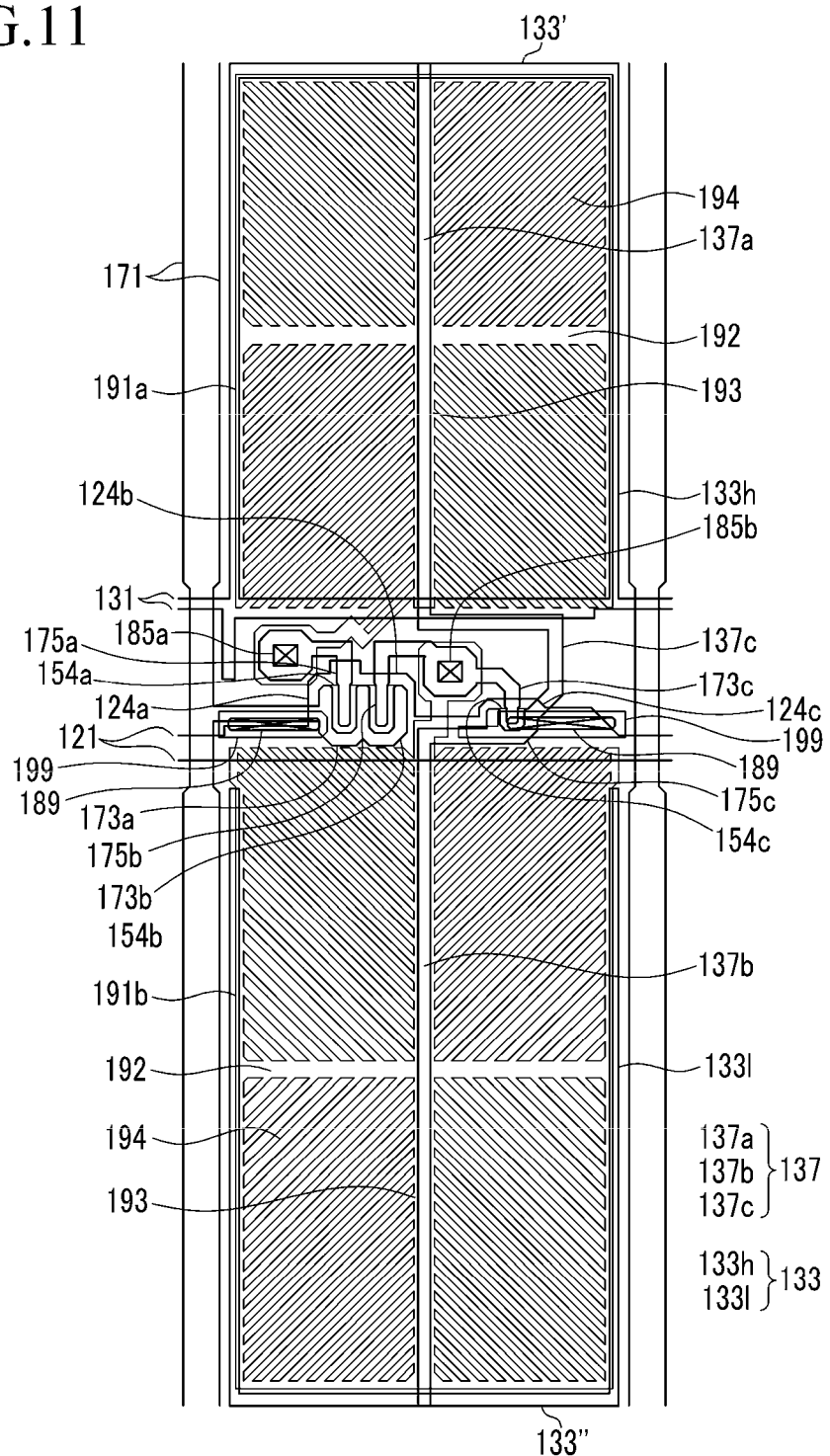

The exemplary embodiment of FIG. 11 differs from the exemplary embodiment of FIG. 4 in that some of the structure for connecting the assistant storage voltage line 137 and the main storage voltage line 131 in the pixel is absent.

More specifically, the exemplary embodiment of FIG. 11 does not include the storage electrode connecting member 139, the third contact hole 185c, and the protrusion 134 of the main storage voltage line 131 that were present in the exemplary embodiment of FIG. 4.

That is, the assistant storage voltage line 137 includes the first assistant storage voltage line 137a, the second assistant storage voltage line 137b, and the third assistant storage voltage line 137c directly connecting them and connected to the third drain electrode 175c. The first assistant storage voltage line 137a, the second assistant storage voltage line 137b, and the third drain electrode 175c are the same as in the fourth exemplary embodiment; however, the third assistant storage voltage line 137c is formed between the third drain electrode 175c and the first assistant storage voltage line 137a and the structure that is connected to the main storage voltage line 131 is omitted.

As a result, in the exemplary embodiment of FIG. 11, the main storage voltage line 131 and the assistant storage voltage line 137 are not connected inside the pixel. Therefor, the storage voltage Vcst may be changed according to the position inside the pixel. However, the storage voltage Vcst applied to the third switching element Qc is not transmitted according to the direction of the longer gate line, but is transmitted according to the data line direction, thereby reducing the deviation. Therefore, the improved characteristic may be obtained compared with the exemplary embodiment in which the storage voltage Vcst applied to the third switching element Qc is transmitted to the main storage voltage line 131 according to the gate line.

Also, in the exemplary embodiment of FIG. 11, the width of the transistor region as the region between the first subpixel and the second subpixel may be further reduced compared with the exemplary embodiments of FIG. 4, FIG. 9, and FIG. 10. This is because the space for the third contact hole 185c may be omitted. As a result, the width of the transistor region is reduced such that the aperture ratio is improved.

Now, an exemplary embodiment of FIG. 12 will be described.

Figure 12:
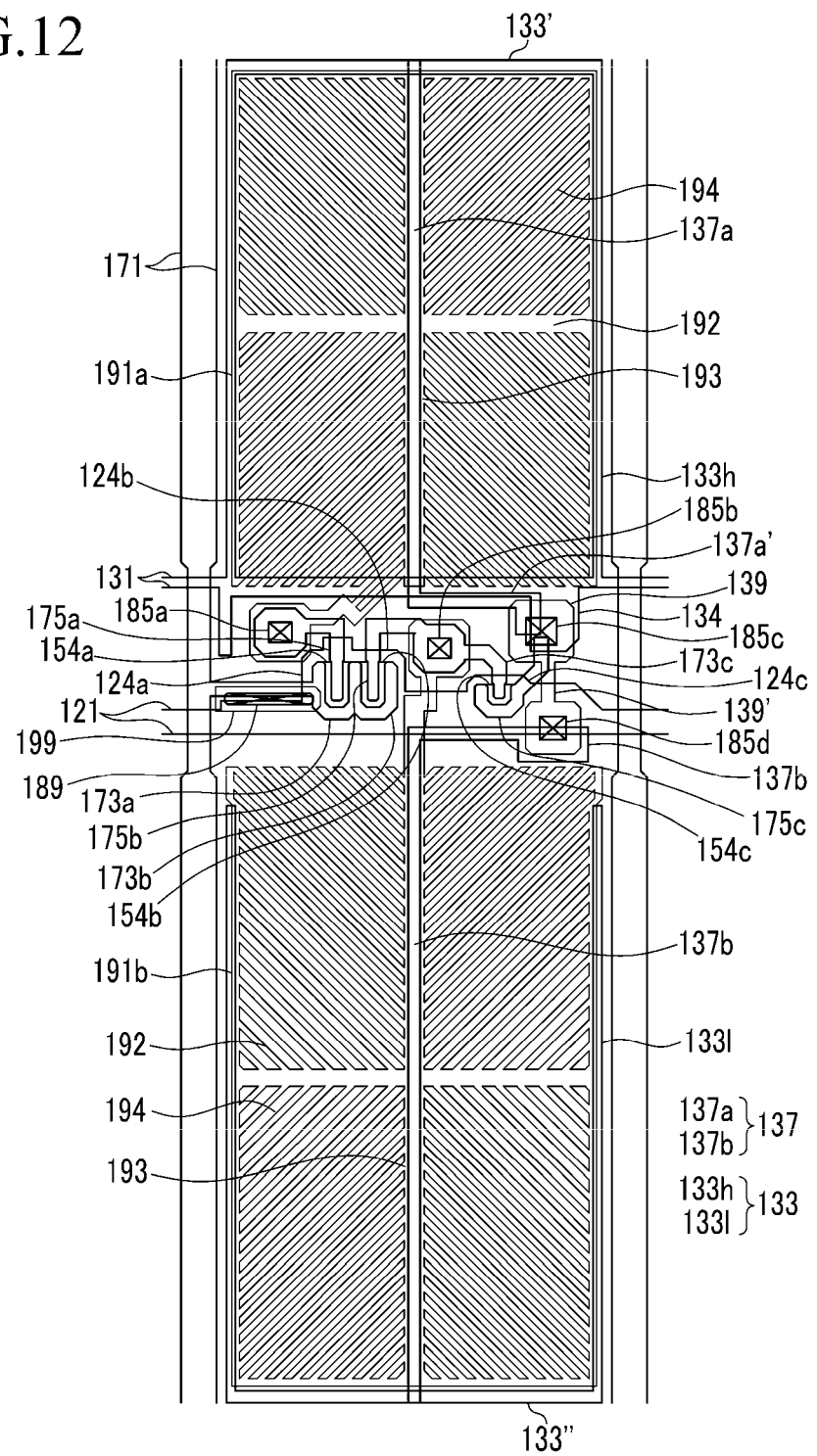

The exemplary embodiment of FIG. 12 differs from the exemplary embodiment of FIG. 4 in that the assistant storage voltage line 137 includes the first assistant storage voltage line 137a and the second assistant storage voltage line 137b separated therefrom.

The first assistant storage voltage line 137a includes a portion overlapping the longitudinal stem 193 of the first subpixel electrode 191a, and a portion 137a' extended into the protrusion 134 of the main storage voltage line 131 while being bent.

Also, the second assistant storage voltage line 137b includes a portion overlapping the longitudinal stem 193 of the second subpixel electrode 191b and a portion 137'b extended while being bent.

In this embodiment, the second assistant storage voltage line 137b is not directly connected to the third drain electrode 175c.

The third drain electrode 175c, the first assistant storage voltage line 137a, and the main storage voltage line 131 are electrically connected to each other on the protrusion 134 of the main storage voltage line 131.

Meanwhile, the passivation layer 180 has contact holes 185c and 185d respectively exposing the expanded portion 137a' of the first assistant storage voltage line 137a and an expanded portion 137b' of the second assistant storage voltage line 137b. A storage electrode connecting member 139' is formed on the two contact holes 185c and 185d, and the first assistant storage voltage line 137a and the second assistant storage voltage line 137b are electrically connected to each other through the two contact holes 185c and 185d.

The first assistant storage voltage line 137a is directly connected to the second assistant storage voltage line 137b of the previous pixel, and the second assistant storage voltage line 137b is directly connected to the first assistant storage voltage line 137a of the next pixel.

That is, in the exemplary embodiment of FIG. 12, the assistant storage voltage line 137a is connected to the storage electrode connecting member 139' in the pixel area, and the assistant storage voltage line 137, and the main storage voltage line 131, and the third drain electrode 175c are connected to one another through the contact hole 185c in the storage electrode connecting member 139'.

Also, in the exemplary embodiment of FIG. 12, the opening 189 and the cover 199 formed at the right side of the transistor region of FIG. 4 is removed, and the opening 189 and the cover 199 are only formed at the left side of the transistor region.

The exemplary embodiment of FIG. 12 further includes the contact hole 185d that is absent in the exemplary embodiment of FIG. 4, and has the storage electrode connecting member 139' connected thereto. With this configuration, the width of the transistor region is wide such that the aperture ratio is reduced. This may be a drawback compared with another exemplary embodiment of the present invention, but the merit of maintaining a constant storage voltage Vcst may make the exemplary embodiment of FIG. 12 desirable in some applications.

In the exemplary embodiments of FIG. 4 to FIG. 12, the data line 171 and the assistant storage voltage line 137 do not overlap. This is because the cell gap is relatively reduced (referring to g of FIG. 6) in the region where the data line 171 and either the gate line 121 or the main storage electrode line 131 intersect when forming the color filter 230 on the lower panel 200 such that the short of the common electrode 270 of the upper panel 200 may be easily generated. However, the assistant storage voltage line 137 is not formed in the region where the data line 171 and either the gate line 121 or the main storage electrode line 131 cross, to minimize the chances of causing a short circuit.

In the exemplary embodiments of FIG. 4 to FIG. 12, the assistant storage voltage line 137 transmitting the storage voltage is not formed with the same layer as the pixel electrodes 191a and 191b, but is formed with the same layer as the data line 171 that is closer to the substrate 110. Therefore, although the storage voltage Vcst is high, the interval from the common electrode 270 is large such that the interference is not generated. In the exemplary embodiment of FIG. 4, the high voltage among the various storage voltages Vcst used in Table 1 to Table 3 may be used, and the voltage of more than 11V where the transmittance is saturated is used as the storage voltage Vcst in the exemplary embodiment of FIG. 4. At this time, the voltage of 7V is used as the common voltage Vcom.

Next, a portion of a pixel according to another exemplary embodiment of the present invention will be described with reference to FIG. 13 and FIG. 14.

Firstly, FIG. 13 will be described.

Figure 13:
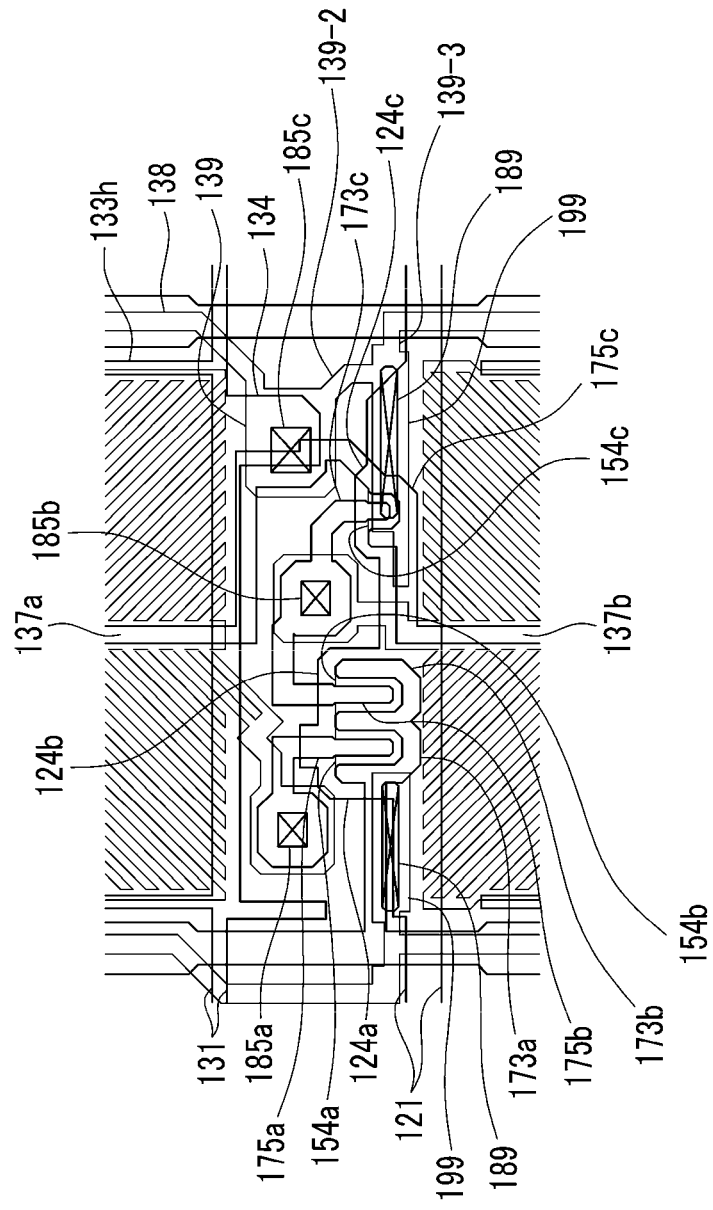
FIG. 13 is a layout view of a portion of one pixel of a display device according to another exemplary embodiment of the present invention.

FIG. 13 is a layout view of a portion of one pixel of a display device according to another exemplary embodiment of the present invention.

In the exemplary embodiment of FIG. 13, a function of the assistant storage voltage line is performed by using the shielding electrode line 138. That is, the exemplary embodiment of FIG. 9 is similar thereto; however, the shielding electrode line 138 includes a portion that does not overlap with the data line 171.

In the exemplary embodiment of FIG. 13, the shielding electrode line 138 extends according to the data line 171 without overlapping the data line 171 in the transistor region, and then bends into the transistor region of one side. That is, the shielding electrode line 138 includes an extension 139-2 that extends from the storage electrode connecting member 139 without overlapping with the data line 171 and bends into the transistor region. In the transistor region, the shielding electrode line 138 becomes connected to the storage electrode connecting member 139, and a connection 139-3 bent toward the data line 171.

The electrode connecting member 139 is connected to the protrusion 134 of the main storage voltage line 131, the third drain electrode 175c, and the first assistant storage voltage line 137a through the contact hole 185c.

The connection 139-3 is connected to a cover 199 covering the opening 189 formed in the passivation layer 180 inside the transistor region positioned at the other side of the data line 171.

Also, the shielding electrode line 138 is supplied with the storage voltage Vcst, thereby having a function of transmitting the storage voltage Vcst in the direction that the data line 171 extends.

The exemplary embodiment of FIG. 13 includes the shielding electrode 138 overlapping the data line 171, and when the color filter 230 is formed in the lower panel 100, the cell gap is relatively reduced (referring to g of FIG. 6) in the region where the data line 171 and either the gate line 121 or the main storage electrode line 131 overlap each other such that the short with the common electrode 270 of the upper panel 200 may be easily generated. Accordingly, in FIG. 13, the shielding electrode 138 curves toward the transistor on the region where the data line 171 and either the gate line 121 or the main storage electrode line 131 overlap each other. As a result, in the region where the data line 171 and either the gate line 121 or the main storage electrode line 131 overlap each other, the shielding electrode line 138 and the common electrode 270 are not easily shorted.

In the exemplary embodiment of FIG. 13, the shielding electrode line 138 also has a role that transmits a storage voltage. Thus, the shielding electrode line 138 may be referred to as an assistant storage voltage line. In the exemplary embodiment in which the shielding electrode line 138 and the first and second assistant storage voltage lines 137a and 137b equally transmit the storage voltage Vcst, one wire among them may be omitted. Omission of the shielding electrode line 138 results in an embodiment that is substantially similar to that of FIG. 4. Also, when the first and second assistant storage voltage line 137a and 137b are omitted, in FIG. 13, the corresponding wiring (the first and second assistant storage voltage lines 137a and 137b) is removed such that the third drain electrode 175c extends to the third contact hole 185c on the protrusion 134 of the main storage voltage line 131 (referring to the shape of the third drain electrode 175c of FIG. 14) in order for the third drain electrode 175c to receive the storage voltage. Also, when the shielding electrode line 138 indicates the assistant storage voltage line instead of the shielding electrode line, 139-2 and 139-3 may indicate the storage electrode connecting member by combining the extension and the connection.

Also, in the exemplary embodiment of FIG. 13, the shielding electrode line 138 transmitting the storage voltage Vcst is formed with the same layer as the pixel electrodes 191a and 191b. Referring to FIG. 6, the common electrode 270 is not far from the shielding electrode line 138 such that it is difficult to use the voltage having a large difference from the common voltage Vcom as the storage voltage Vcst. If the difference between the common voltage Vcom and the storage voltage Vcst is large, the circumferential liquid crystal molecules become arranged by the electric field in an undesired arrangement direction such that the difference causes light leakage. Therefore, in the exemplary embodiment of FIG. 13, the voltage having the small difference with the common voltage Vcom (7 V) is used among the various storage voltages Vcst used in Table 1 to Table 3, and the voltage of 9 V may be used as the storage voltage Vcst.

Next, an exemplary embodiment having a different structure for applying a storage voltage Vcst to a pixel of each color will be described based on an exemplary embodiment of FIG. 14.

Figure 14:
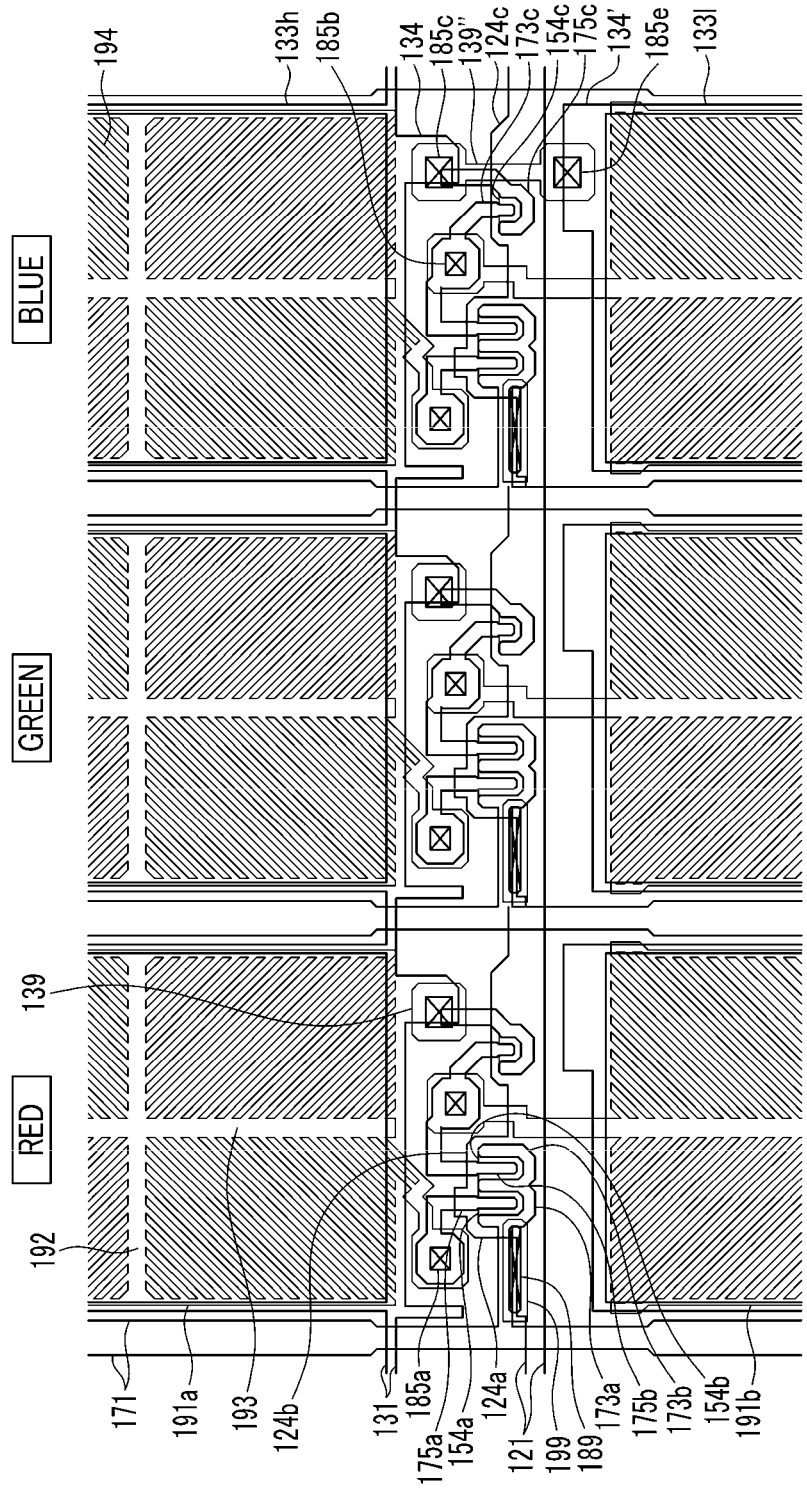
FIG. 14 is a layout view of three neighboring pixels of a display device according to another exemplary embodiment of the present invention.

FIG. 14 is a layout view of three neighboring pixels of a display device according to another exemplary embodiment of the present invention.

An arrangement structure of a pixel shown in the exemplary embodiment of FIG. 14 is slightly different from that of FIG. 4 and FIG. 9 to FIG. 13. However, the circuit diagram of the pixel structure is the same as the circuit diagram of FIG. 3.

In FIG. 14, a red pixel, a green pixel, and a blue pixel are shown going from left to right. Among the three pixels, a structure for transmitting the storage voltage Vcst in the direction that the data line 171 extends is only formed in one pixel (a blue pixel in the exemplary embodiment of FIG. 14).

That is, in the red pixel and the green pixel, the main storage electrode line 131 and the third drain electrode 175c are connected by using the storage electrode connecting member 139.

However, in the blue pixel, a storage electrode connecting member 139" that extends from the storage electrode connecting member 139 is formed to connect a protrusion 134' of the second storage electrode 133l of the second subpixel as well as the connection of the main storage electrode line 131 and the third drain electrode 175c, and thereby the storage voltage Vcst is directly transmitted to the side of the second subpixel. The second storage electrode 133l (hereafter referred to as the second connection portion) of the second subpixel is connected to the first storage electrode 133h (hereafter referred to as the first connection portion) of the first subpixel of the underlying pixel, and the first storage electrode 133h is directly connected to the main storage electrode line 131, and thereby the storage voltage Vcst is constant. As shown in FIG. 14, although the storage electrode connecting member 139" formed in the blue pixel is formed one by one among a plurality of neighboring pixels, the storage voltage Vcst may be constantly and sufficiently maintained.

In FIG. 14, the structure including the assistant storage voltage line or the shielding electrode line is not shown, but as shown in FIG. 4 and FIG. 9 to FIG. 13, when forming the wiring (the assistant storage voltage line or the shielding electrode line) transmitting the storage voltage Vcst in the vertical direction, one wire may be formed among a plurality of neighboring pixels.

In the exemplary embodiment of FIG. 14, the data line 171 and the storage electrode connecting member 139" do not overlap with each other. This is because the cell gap is relatively reduced (referring to g of FIG. 6) in the region where the data line 171 and either the gate line 121 or the main storage electrode line 131 intersect when forming the color filter 230 on the lower panel 200 such that the common electrode 270 of the upper panel 200 may easily generated a short circuit. However, the storage electrode connecting member 139" is not formed in the region where the data line 171 and either the gate line 121 or the main storage electrode line 131 cross such that there is no possibility of short circuit generation.

Also, in the exemplary embodiment of FIG. 14, the storage electrode connecting member 139" transmitting the storage voltage in the direction of the data line 171 is formed with the same layer as the pixel electrodes 191a and 191b. However, the storage electrode connecting member 139" is not formed on the data line 171 and hence it is not too close to the common electrode 270. In contrast, the storage electrode connecting member 139" is formed with the same layer as the data line 171 such that the distance to the common electrode 270 is not very far, and thereby it is preferable if the storage voltage Vcst to be used is more than the storage voltage of the exemplary embodiment of FIG. 13 and less than the storage voltage of FIG. 4 to FIG. 12. That is, when using the common voltage Vcom of 7V, the voltage of more than 9 V and less than 11 V may be used as the storage voltage Vcst.

Also, the structure of the storage electrode connecting member 139" used in FIG. 14 may be applied to the exemplary embodiments of FIG. 4, FIG. 9, FIG. 10, FIG. 11, and FIG. 12. Furthermore, the structure of the storage electrode connecting member 139" used in FIG. 14 may be applied to the various display panels including the structure transmitting the storage voltage Vcst in the direction of the data line 171.

In the exemplary embodiments above, the storage voltage and the storage voltage line are used. However, this is not a limitation of the invention. Further, as the voltage that is commonly and respectively applied to the plurality of pixels through the wiring may use the storage voltage and/or the storage voltage line, this is included in the range of the present invention. Various voltages and lines may be used, including but not limited to a common voltage, a reference voltage, or a driving voltage. That is, in the pixel of the organic light emitting device, a driving voltage applied to a driving transistor connected to an organic light emitting element may be one example. Therefore, in the above specification, the item that is referred to as the main storage voltage line and the assistant storage voltage line (or the shielding electrode line) is used. However, the transmitted voltage may not be the storage voltage such that the item thereof may be generally called the first wiring and the second wiring. The voltage that is commonly applied to each pixel may be called the first voltage.

Figure 15:
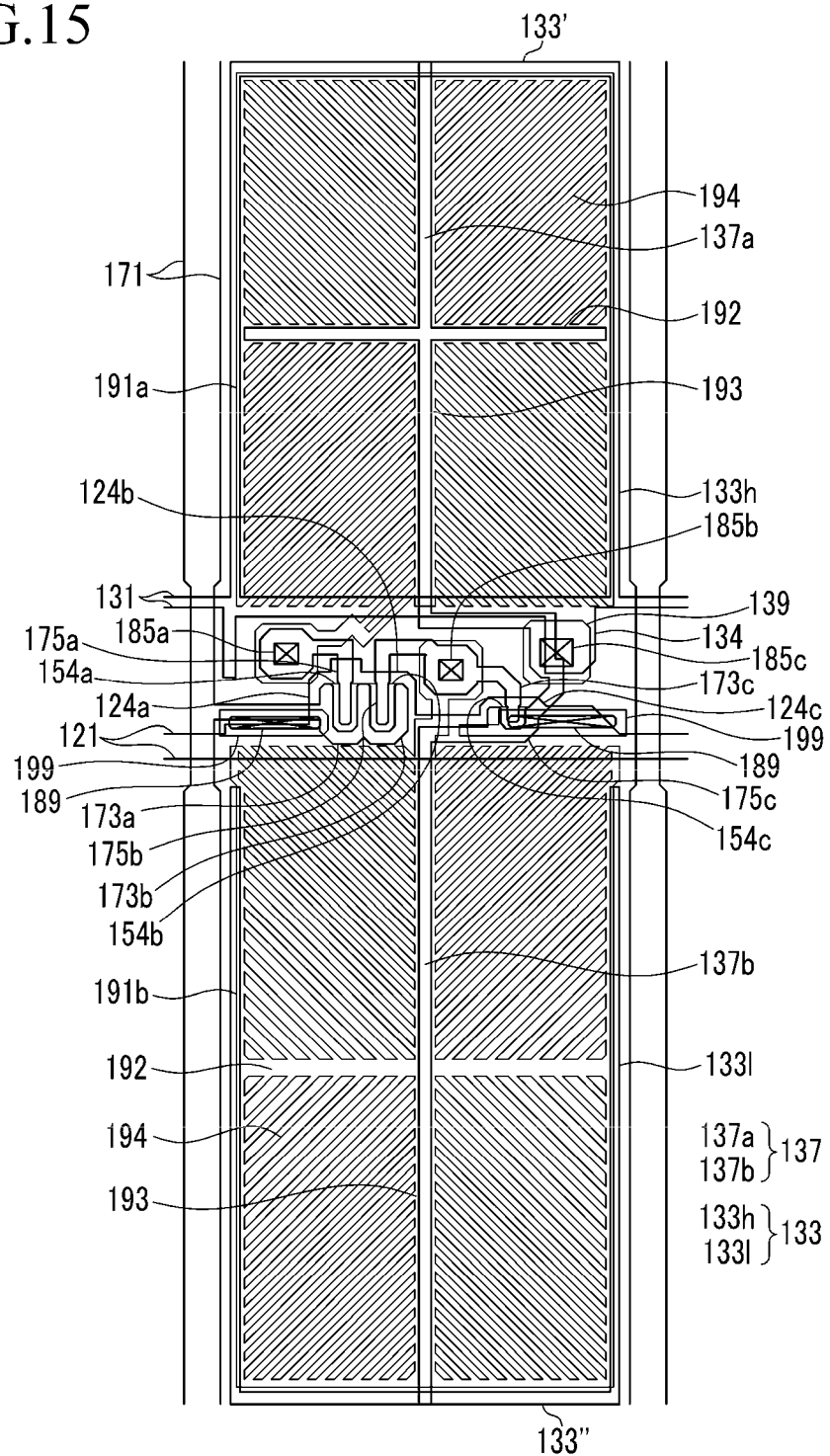
FIG. 15 to FIG. 17 are layout views of one pixel of a display device according to another exemplary embodiment of the present invention.
Figure 16:
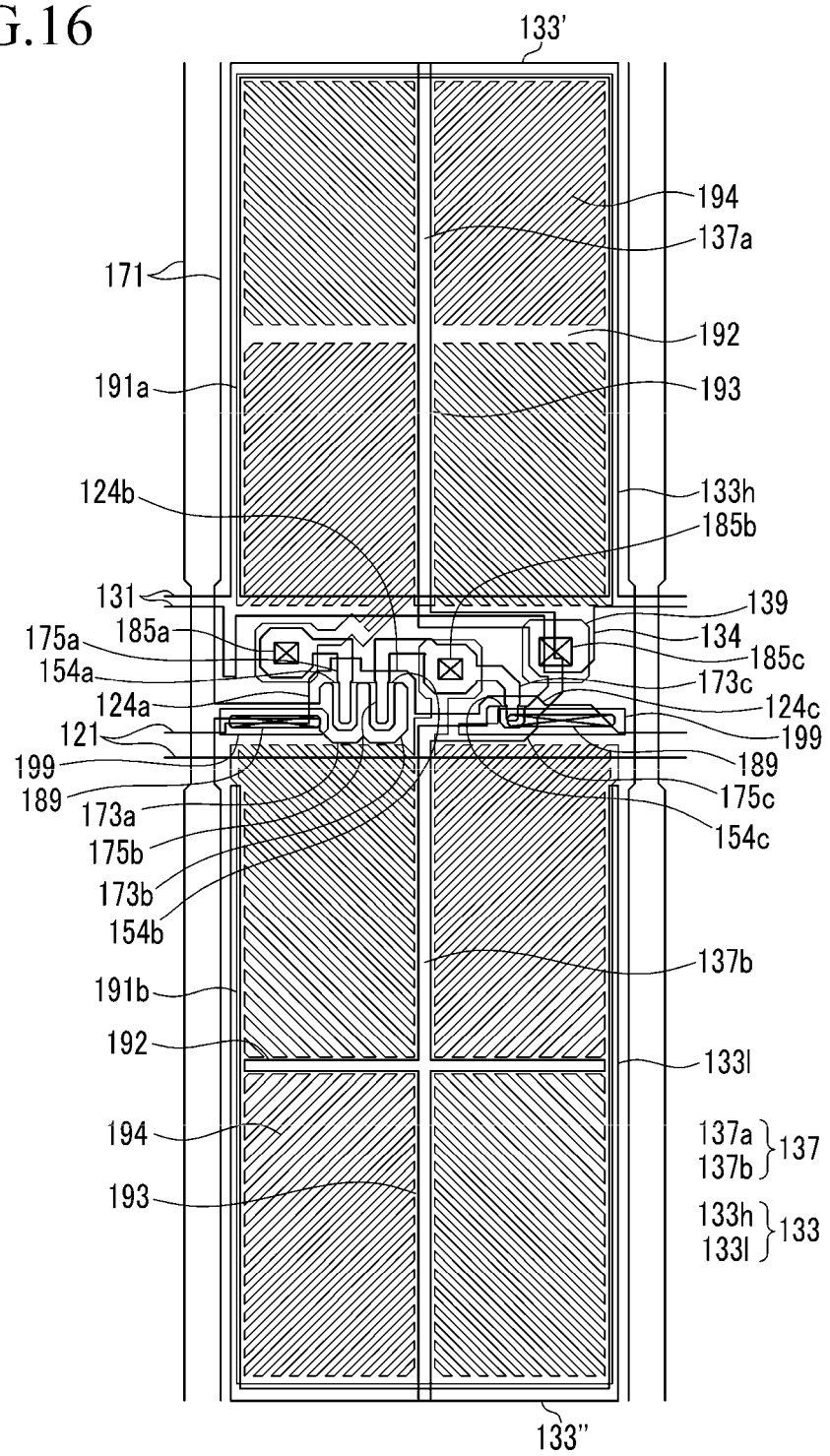
Figure 17:
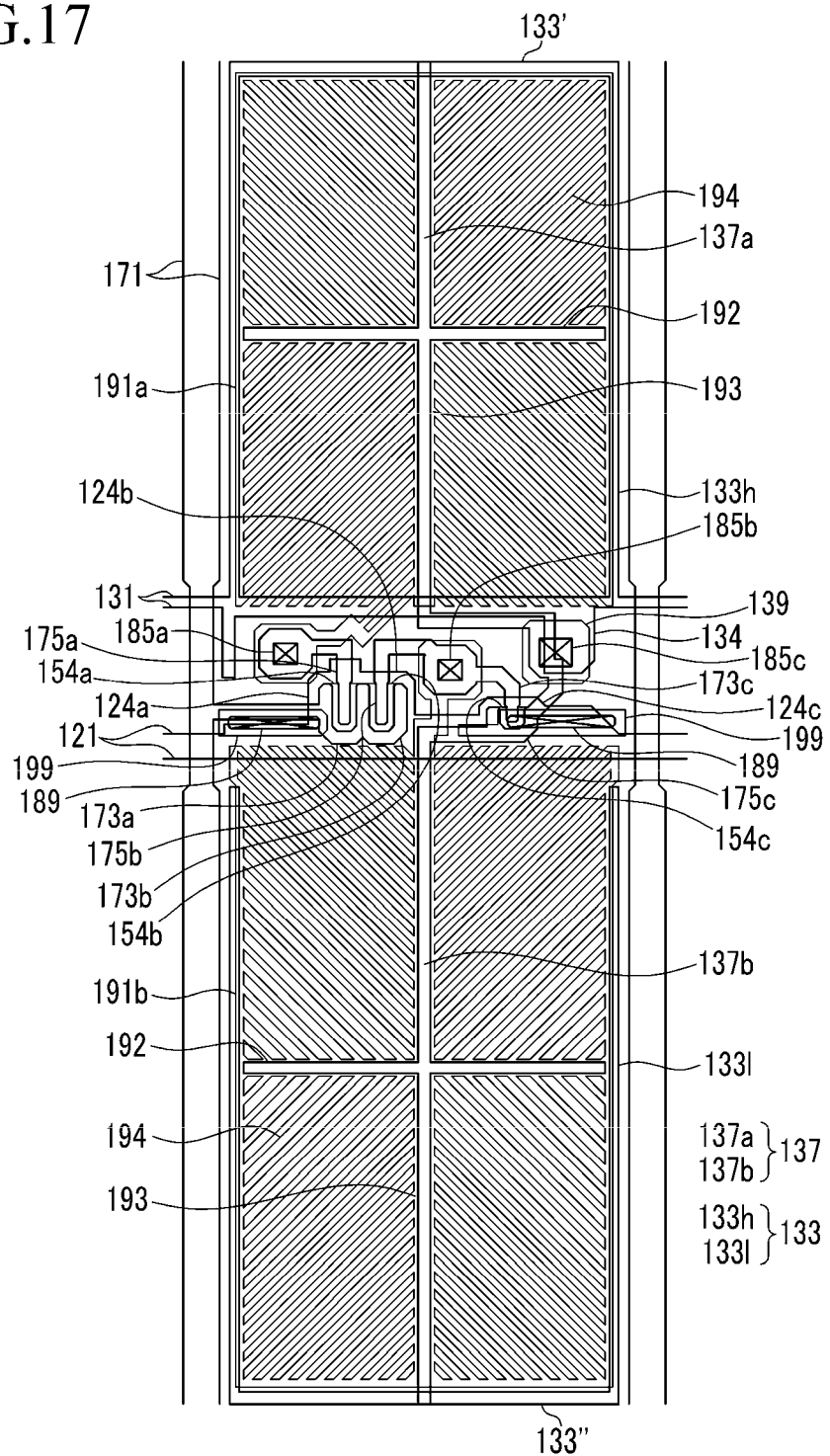

FIG. 15 to FIG. 17 are layout views of one pixel of a display device according to another exemplary embodiment of the present invention.

In the exemplary embodiments of FIG. 15 to FIG. 17 as exemplary variations of FIG. 4, a structure of the first assistant storage voltage line 137a or the second assistant storage voltage line 137b is changed.

That is, in FIG. 15, the first assistant storage voltage line 137a overlaps the transverse stem 192 as well as the longitudinal stem 193 of the first subpixel electrode 191a, thereby forming a cross-shaped portion. As a result, the storage capacitance is increased such that display quality is improved compared with the exemplary embodiment of FIG. 4.

Meanwhile, in FIG. 16, the second assistant storage voltage line 137b overlaps the transverse stem 192 and the longitudinal stem 193 of the second subpixel electrode 191b to form cross shape. In FIG. 17, the first assistant storage voltage line 137a and the second assistant storage voltage line 137b both overlap the transverse stem 192, thereby forming the cross. As a result, in FIG. 16 and FIG. 17, the storage capacitance is higher than in the exemplary embodiment of FIG. 4 such that display quality from a position other than the front is improved.

Next, another exemplary embodiment of the present invention will be described.

A liquid crystal display according to an exemplary embodiment of the present invention will be described with reference to FIG. 18 to FIG. 21. A liquid crystal display shown in FIG. 18 may have a pixel with the equivalent circuit shown in FIG. 3.

Figure 18:
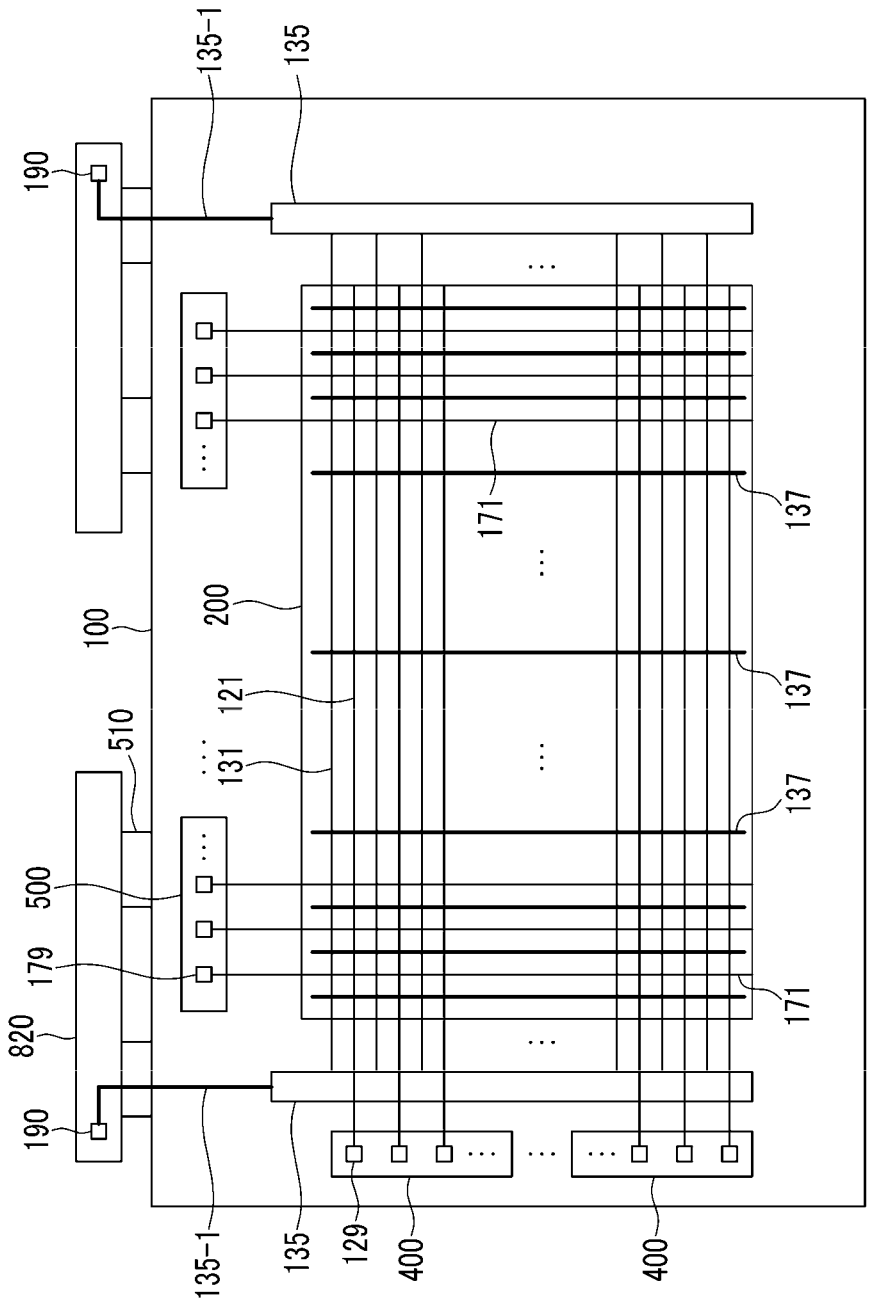
FIG. 18 is a schematic view of a liquid crystal display according to an exemplary embodiment of the present invention.
Figure 19:
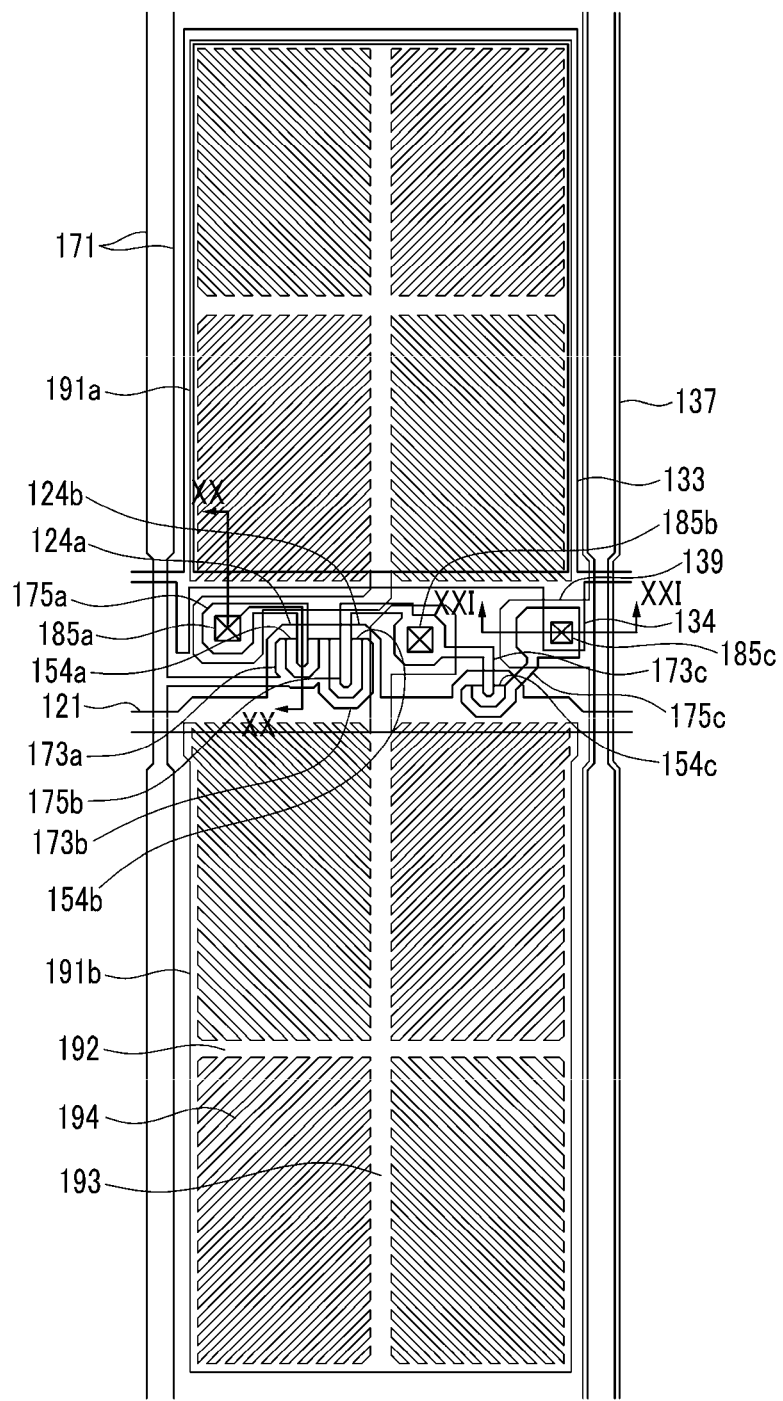
FIG. 19 is a layout view of one pixel of the liquid crystal display of FIG. 18.
Figure 20:
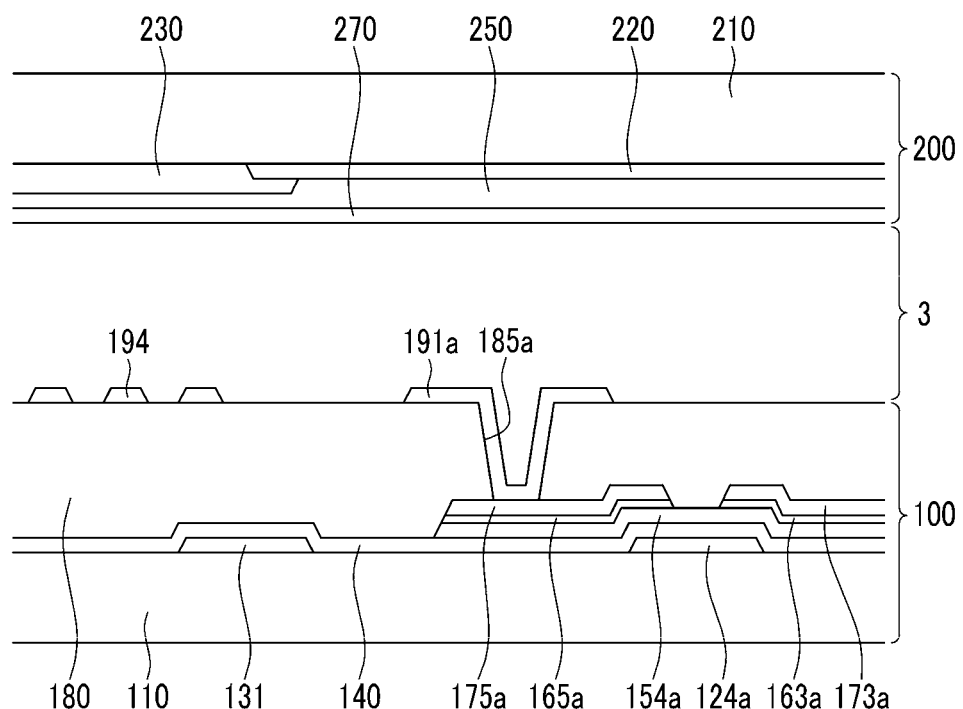
FIG. 20 is a cross-sectional view taken along the line XX-XX of FIG. 19.
Figure 21:
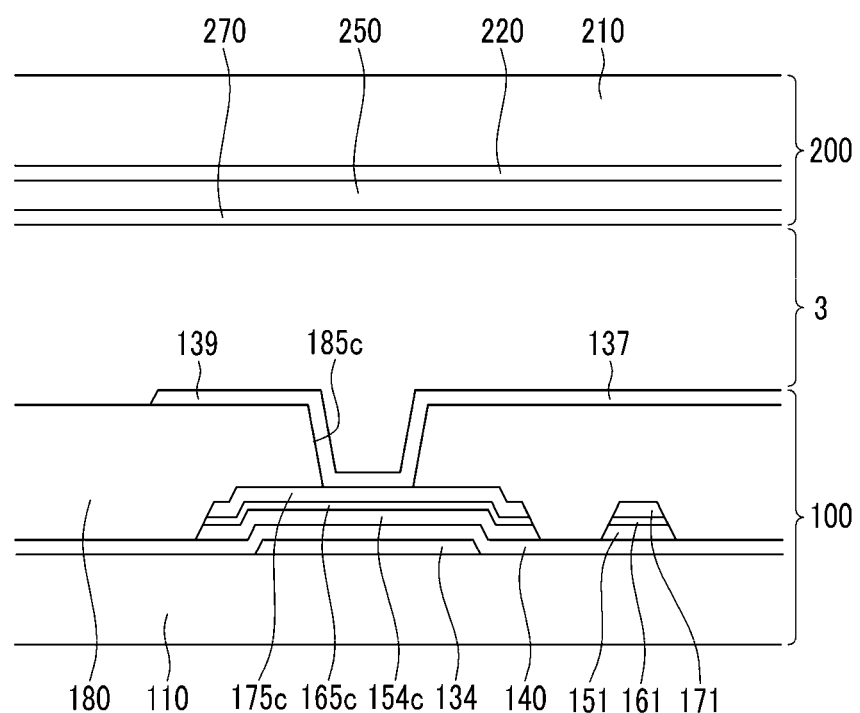
FIG. 21 is a cross-sectional view taken along the line XXI-XXI of FIG. 19.

FIG. 18 is a schematic view of a liquid crystal display according to an exemplary embodiment of the present invention, and FIG. 19 is a layout view of one pixel of the liquid crystal display of FIG. 18. FIG. 20 is a cross-sectional view taken along the line XX-XX of FIG. 19, and FIG. 21 is a cross-sectional view taken along the line XXI-XXI of FIG. 19.

Referring to FIG. 18, a liquid crystal display according to the present exemplary embodiment includes a lower panel 100 and an upper panel 200.

In the lower panel 100, a plurality of gate lines 121, a plurality of data lines 171, a plurality of main storage electrode lines 131, a gate driver 400, and a data driver 500 are formed. The gate line 121 is connected to a gate pad 129 receiving the gate signal made of the combination of the gate-on voltage Von and the gate-off voltage Voff from the gate driver 400, and the data line 171 is connected to a data pad 179 receiving a data signal from the data driver 500.

The gate driver 400 may be directly mounted on the display panel assembly 300 in the form of at least one integrated circuit or an IC chip, may be mounted on a flexible printed circuit film (not shown) to be attached to the lower panel 100, or may be mounted on a separate printed circuit board (not shown). Also, the gate driver 400 may be formed on the lower panel 100 along with the gate line 121, the data line 171, and the thin film transistor.

The gate line 121 and the data line 171 intersect, thereby defining pixels PX forming a display area. In FIG. 18, the region where the lower panel 100 and the upper panel 200 overlap includes the display area. A storage voltage bar 135 applying the storage voltage to the main storage electrode line 131 is formed in a peripheral area of both sides of the display area. The storage voltage bar 135 has a rectangular shape. In the present exemplary embodiment, the storage voltage bar 135 is formed with the rectangular shape. However this is not a limitation of the invention, which may be implemented in various other shapes such as an oval shape. Also, in the present exemplary embodiment, the storage voltage bar 135 is positioned in the peripheral area of both sides of the display area. This is not a limitation of the invention either, and it may be positioned at just one side of the display area.

Here, the main storage electrode line 131 is formed with the same layer as the gate line 121, and the storage voltage bar 135 is formed with the same layer as the data line 171. That is, the main storage electrode line 131 and the storage voltage bar 135 are formed with different layers. The main storage electrode line 131 and the storage voltage bar 135 that are formed with the different layers are connected to each other through a connection electrode (not shown) formed with the same layer as a pixel electrode 191 that will be described later.

The storage voltage line 130 includes a plurality of main storage voltage lines 131 and a plurality of assistant storage voltage lines 137.

A printed circuit board (PCB) 520 receiving an image signal from the outside of the liquid crystal display and applying a driving signal to the liquid crystal display on the lower panel 100 is connected to the lower panel 100 through a flexible printed circuit substrate 510.

The storage voltage bar 135 is connected to the first voltage pad 190 receiving the voltage (hereinafter referred to a storage voltage, and even if the component is different, it includes the voltage commonly applied to a plurality of pixels) commonly applied to the pixel through a first signal line 135-1 (referred to as the storage voltage transmitting line, or the first storage voltage transmitting line, to be distinguished from 135-2). The first voltage pad 190 is formed in a printed circuit board (PCB) 520.

The assistant storage voltage line 137 is formed on each data line 171 (referring to FIG. 19). That is, the number of assistant storage voltage lines 137 is the same as the number of data lines 171. Each assistant storage voltage line 137 is connected to the main storage electrode line 131 to disperse the storage voltage.

As described above, the storage voltage is dispersed inside the liquid crystal display by the assistant storage voltage line 137 such that the change of the storage voltage may be prevented inside the liquid crystal display. Also, each assistant storage voltage line 137 is positioned on the data line 171 such that the data voltage applied to the data line 171 is prevented from affecting the liquid crystal layer 3.

Referring to FIG. 19 to FIG. 21, the liquid crystal display of FIG. 18 will be described in detail.

A liquid crystal display according to the present exemplary embodiment includes a lower panel 100 and an upper panel 200, a liquid crystal layer 3 interposed between the two display panels 100 and 200, and a pair of polarizers (not shown) attached to the outer surfaces of the display panels 100 and 200.

First, the lower panel 100 will be described.

A gate line 121 and a main storage electrode line 131 are formed on an insulation substrate 110 made of transparent glass or plastic. The gate line 121 includes the first gate electrode 124a, the second gate electrode 124b, and the third gate electrode 124c. The main storage electrode line 131 includes a storage electrode 133 enclosing the first pixel electrode 191a and a protrusion 134 protruding in the direction of the gate line 121.

A gate insulating layer 140 is formed on the gate line 121 and the main storage electrode line 131. The first semiconductor 154a, the second semiconductor 154b and the third semiconductor 154c are formed on the gate insulating layer 140.

A plurality of ohmic contacts 163a and 165a, and 165c are respectively formed on the first semiconductor 154a and the third semiconductor 154c. An ohmic contact (not shown) is formed on the second semiconductor 154b.

A data conductor (171, 173c, 175a, 175b, and 175c) including a plurality of data lines 171 including the first source electrode 173a and the second source electrode 173b, the first drain electrode 175a, the second drain electrode 175b, the third source electrode 173a, and the third drain electrode 175c is formed on the ohmic contacts 163a, 165a, and 165c and the gate insulating layer 140. The third drain electrode 175c overlaps the protrusion 134 of the main storage electrode line 131.

The first gate electrode 124a, the first source electrode 173a, and the first drain electrode 175a form the first thin film transistor Qa along with the first semiconductor 154a, and the channel of the thin film transistor is formed in the semiconductor portion 154a between the first source electrode 173a and the first drain electrode 175a.

Similarly, the second gate electrode 124b, the second source electrode 173b, and the second drain electrode 175b form the second thin film transistor Qb along with the second semiconductor 154b, and the channel of the thin film transistor is formed in the semiconductor portion 154b between the second source electrode 173b and the second drain electrode 175b, and the third gate electrode 124c, the third source electrode 173c, and the third drain electrode 175c form the third thin film transistor Qc along with the third semiconductor 154c, and the channel of the thin film transistor is formed in the semiconductor portion 154c between the third source electrode 173c and the third drain electrode 175c.

A passivation layer 180 is formed on the data conductor (171, 173c, 175a, 175b, and 175c) and the exposed portion of the semiconductors 154a, 154b, and 154c. The passivation layer 180 is made of an inorganic insulator such as silicon nitride and silicon oxide. However, the passivation layer 180 may be made of an organic insulator and the surface thereof may be flat. In the case of the organic insulator, the passivation layer 180 may have a photosensitivity and a dielectric constant of less than about 4.0. The passivation layer 180 can have a dual-layered structure made of a lower inorganic layer and an upper organic layer at the exposed region of the semiconductor 154 in order to sustain the inorganic layer's excellent insulating characteristic and to not damage the exposed region of the semiconductor 154a, 154b, and 154c.

The passivation layer 180 includes the first contact hole 185a, the second contact hole 185b, and the third contact hole 185c respectively exposing the first drain electrode 175a, the second drain electrode 175b, and the third drain electrode 175c.

A pixel electrode 191 including the first subpixel electrode 191a and second subpixel electrode 191b and an assistant storage voltage line 137 are formed on the passivation layer 180. The pixel electrode 191 and the assistant storage voltage line 137 may be made of a transparent conductive material such as ITO or IZO, or a reflective metal such as aluminum, silver, chromium, or alloys thereof.

The first subpixel electrode 191a and the second subpixel electrode 191b neighbor each other in the column direction and the overall shape thereof is quadrangular, and includes a cross stem having a transverse stem 192 and a longitudinal stem 193 intersecting thereto. The first and second sub-pixel electrodes 191a and 191b are divided into four sub-regions by the transverse stem 192 and the longitudinal stem 193, and each of the sub-regions includes a plurality of minute branches 194.

Some minute branches 194 of the first subpixel electrode 191a and the second subpixel electrode 191b obliquely extend in the left upper direction from the transverse stem 192 or the longitudinal stem 193, and other minute branches 194 obliquely extend in the right upper direction from the transverse stem 192 or the longitudinal stem 193. Also, some other minute branches 194 extend in the left lower direction from the transverse stem 192 or the longitudinal stem 193, and the other minute branches 194 obliquely extend in the right lower direction from the transverse stem 192 or the longitudinal stem 193.

Each of the minute branches 194 form an angle of about 40 degrees to 45 degrees with the gate line 121 or the transverse stem 192. Particularly, the minute branches 194 included in the first subpixel electrode 191a may form an angle of about 40 degrees with the transverse stem 192, and the minute branches 194 included in the second subpixel electrode 191b may form an angle of about 45 degrees with the transverse stem 192. Also, the minute branches 194 of two neighboring subregions may intersect.

Although not shown, the width of the minute branches 194 may gradually change going from one end to the other.

The first subpixel electrode 191a and the second subpixel electrode 191b are physically and electrically connected to the first drain electrode 175a and the second drain electrode 175b through contact holes 185a and 185b, respectively, and receive the data voltage from the first drain electrode 175a and the second drain electrode 175b. In this case, a part of the data voltage applied to the second drain electrode 175b is divided through the third source electrode 173c, such that the magnitude of the voltage applied to the second subpixel electrode 191b may be smaller than that of the voltage applied to the first subpixel electrode 191a. In this case, the voltage applied to the first subpixel electrode 191a and the second subpixel electrode 191b is positive, and in contrast, in a case where the voltage applied to the first subpixel electrode 191a and the second subpixel electrode 191b is negative, the voltage applied to the first subpixel electrode 191a is smaller than the voltage applied to the second subpixel electrode 191b.

An area of the second subpixel electrode 191b may be approximately one to two times larger than that of the first subpixel electrode 191a.

The assistant storage voltage line 137 is positioned at the portion corresponding to each data line 171, and includes a connecting member 139 extending toward the protrusion 134 of the main storage electrode line 131. The connecting member 139 is connected to the third drain electrode 175c through the third contact hole 185c.

Next, the upper panel 200 will be described.

A light blocking member 220 is formed on an insulation substrate 210 made of transparent glass or plastic. The light blocking member 220 is referred to as a black matrix and prevents light leakage.

A plurality of color filters 230 are formed on the substrate 210 and the light blocking member 220. Most of the color filters 230 are formed in the region enclosed by the light blocking member 220, and may extend according to a column of the pixel electrode 191. Each color filter 230 may display one of three primary colors such as red, green, and blue. However, the invention is not limited to the three primary colors such as red, green, and blue, and may display one of cyan, magenta, yellow, and white-based colors.

At least one of the light blocking member 220 and the color filter 230 may be formed on the lower substrate 110.

An overcoat 250 is formed on the color filter 230 and the light blocking member 220. The overcoat 250, which may be made of an insulating material, prevents the color filter 230 from being exposed, and has a flat surface. The overcoat 250 may be omitted.

A common electrode 270 is formed on the overcoat 250.

Alignment layers (not shown) are formed on both surfaces of the display panels 100 and 200, and they may be vertical alignment layers.

Polarizers (not shown) are formed on the outer surface of the display panels 100 and 200, the polarization axis of the two polarizers are nonparallel, and one polarization axis thereof may be parallel to the gate lines 121. In a case of a reflective liquid crystal display, one of the two polarizers may be omitted.

The first subpixel electrode 191a and the second subpixel electrode 191b applied with the data voltage generate an electric field together with the common electrode 270 of the common electrode panel 200 that receives the common voltage, to thereby determine an orientation of liquid crystal molecules of the liquid crystal layer 3 between the two electrodes 191a and 191b, and 270. Polarization of light that transmits through the liquid crystal layer 3 depends on the orientation of the liquid crystal molecules.

The first and second subpixel electrodes 191a and 191b and the common electrode 270 form the liquid crystal capacitors Clc_H and Clc_L to maintain the applied voltage after the thin film transistor is turned off. At this time, the edges of the minute branches 194 make the horizontal component perpendicular to the edges of the minute branches 194, and an inclination direction of liquid crystal molecules (not shown) is determined in the direction determined by the horizontal component. Here, the liquid crystal molecules initially tend to incline in the direction perpendicular to the edge of the minute branches 194. However, the directions of the horizontal components of the electric field by the edge of the neighboring minute branches 194 are opposite, and the interval between the minute branches 194 is very narrow such that the liquid crystal molecules that tend to incline in the opposite direction to each other are tilted in the direction parallel to the length direction of the minute branches 194.

Here, in an exemplary embodiment of the present invention, the minute branches 194 of one pixel extend in four directions such that the liquid crystal molecules are inclined in four different directions. Therefore, the viewing angle of the liquid crystal display is widened by varying the inclined directions of the liquid crystal molecules.

Hereinafter, referring to FIG. 22 and FIG. 23, a liquid crystal display according to another exemplary embodiment of the present invention will be described.

Figure 22:
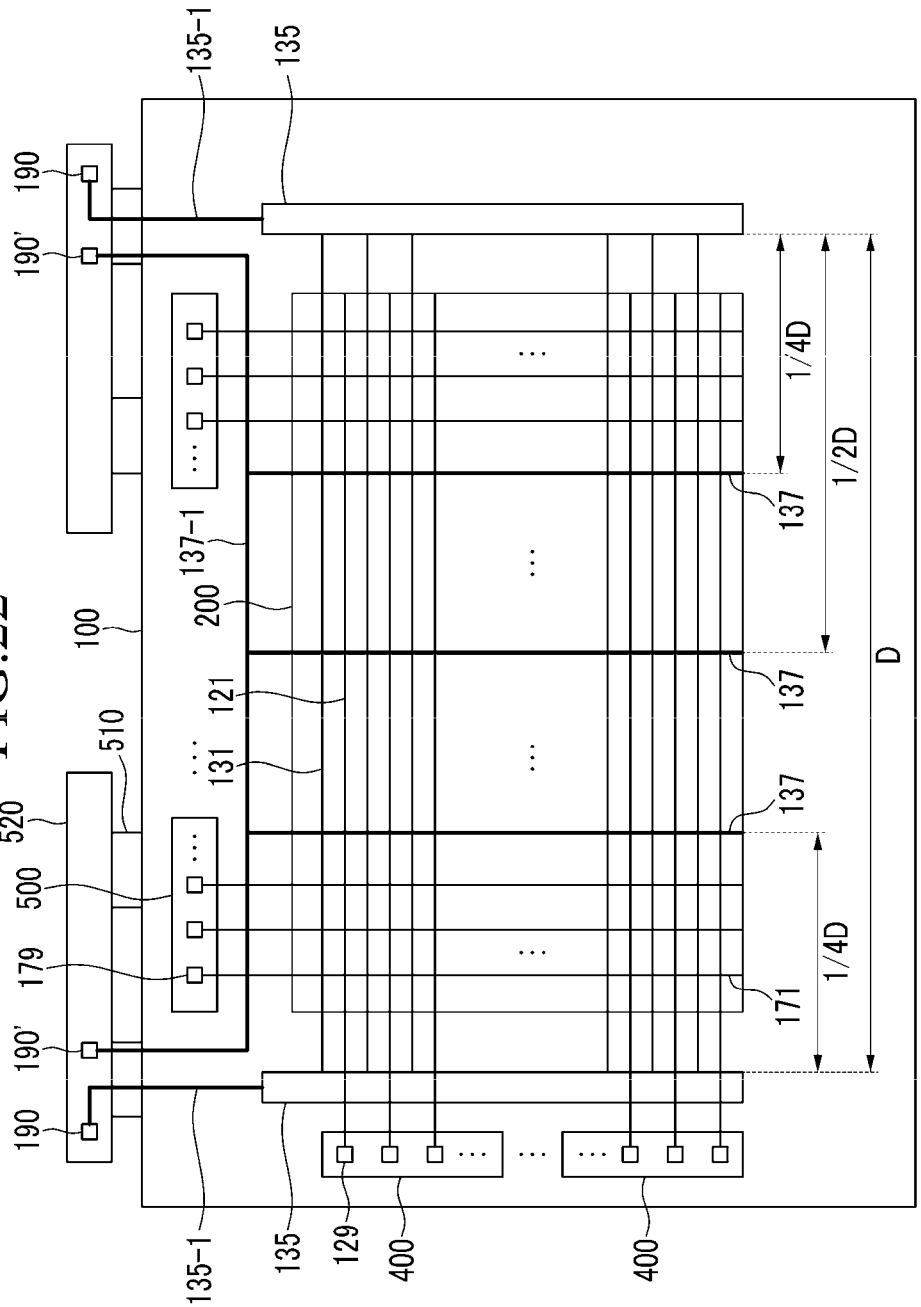
FIG. 22 is a schematic view of a liquid crystal display according to another exemplary embodiment of the present invention.
Figure 23:
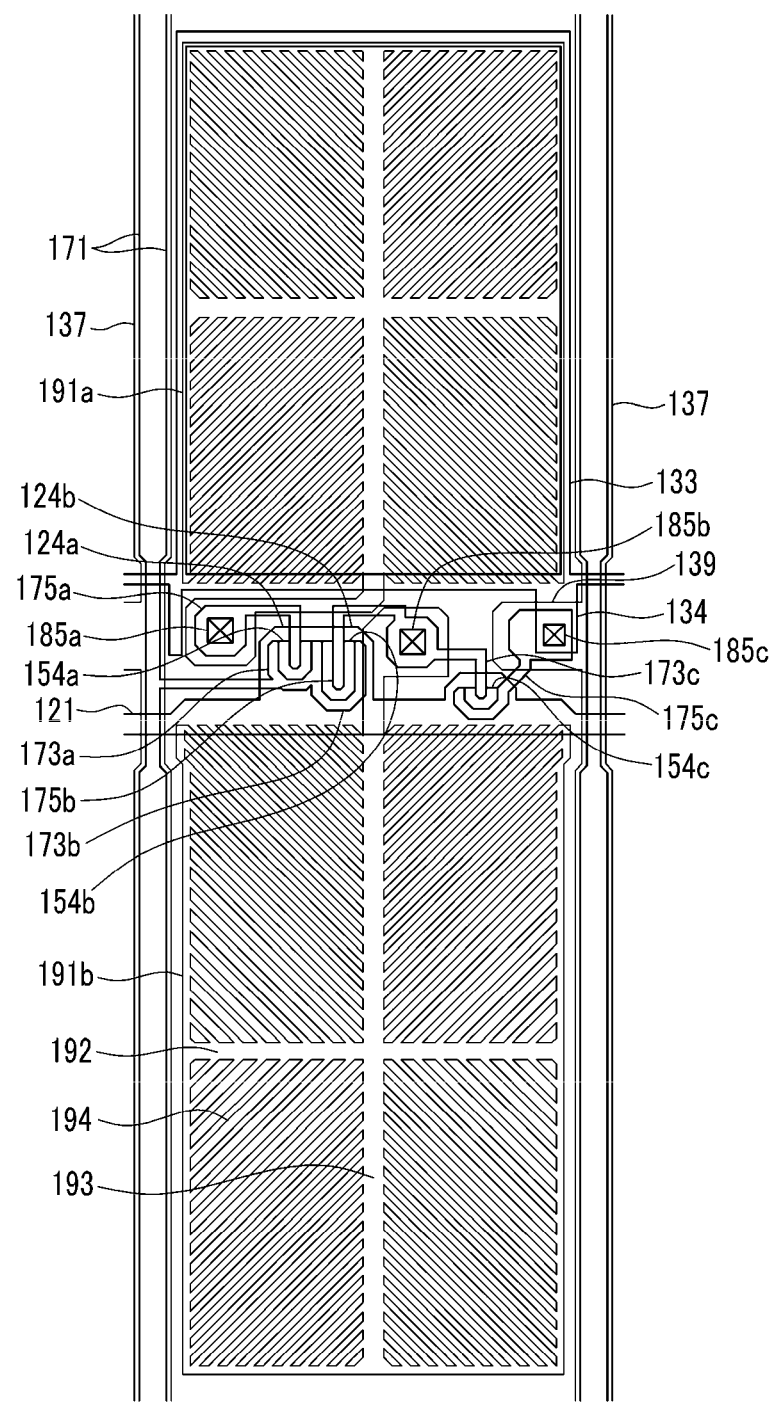
FIG. 23 is a layout view of one pixel of the liquid crystal display of FIG. 22.

FIG. 22 is a schematic view of a liquid crystal display according to another exemplary embodiment of the present invention, and FIG. 23 is a layout view of one pixel of the liquid crystal display of FIG. 22.

Referring to FIG. 22 and FIG. 23, the liquid crystal display according to the present exemplary embodiment is similar to the liquid crystal display according to the exemplary embodiment shown in FIG. 18 to FIG. 21. The description of similar portions is omitted.

Unlike in the liquid crystal display according to the exemplary embodiment shown in FIG. 18 to FIG. 21, in the liquid crystal display according to the present exemplary embodiment, the assistant storage voltage line 137 is formed at a ¼-, ½-, and ¾-way between the storage voltage bars 135, which are separated by a total distance D. That is, in the liquid crystal display according to FIG. 22, three assistant storage voltage lines 137 are formed. Each assistant storage voltage line 137 is connected to an assistant voltage pad 190' transmitting an assistance voltage through the assistant storage voltage bar 137-1. The assistant voltage pad 190' is formed in the printed circuit board (PCB) 520.

Each assistant storage voltage line 137 is positioned on the data line 171, thereby receiving the assistance voltage from the assistant voltage pad 190'. The magnitude of the storage voltage applied to each main storage electrode line 131 is more than 1 V and less than 20 V, and the magnitude of the assistance voltage applied to each assistant storage voltage line 137 is equal to or larger than the magnitude of the storage voltage applied to the main storage electrode line 131 and is less than a value of which 10 V is added to the storage voltage applied to each main storage electrode line 131. Preferably, the magnitude of the storage voltage applied to each main storage electrode line 131 is larger than 7 V and less than 15 V, and the magnitude of the assistance voltage applied to each assistant storage voltage line 137 is equal to or larger than the storage voltage applied to each main storage electrode line 131 and is less than a value of which 3V is added to the storage voltage applied to each main storage electrode line 131.

As described above, three assistant storage voltage lines 137 are formed, and the assistance voltage that is equal to or larger than the storage voltage applied to the storage voltage bar 135 is applied to each assistant storage voltage line 137 such that the change of the storage voltage may be prevented inside the liquid crystal display.

On the other hand, when the change of the storage voltage is not large inside the liquid crystal display, the assistance voltage may not be applied.

In the present exemplary embodiment, the assistant storage voltage line 137 is formed at ¼, ½, and ¾ of the distance D between the storage voltage bars 135 positioned on two sides. However, the assistant storage voltage line 137 is only formed at the ½-way point between the storage voltage bars 135. Also, the assistant storage voltage line 137 may be formed in the data driver 500.

Hereinafter, referring to FIG. 24 to FIG. 26, a liquid crystal display according to another exemplary embodiment of the present invention will be described.

Figure 24:
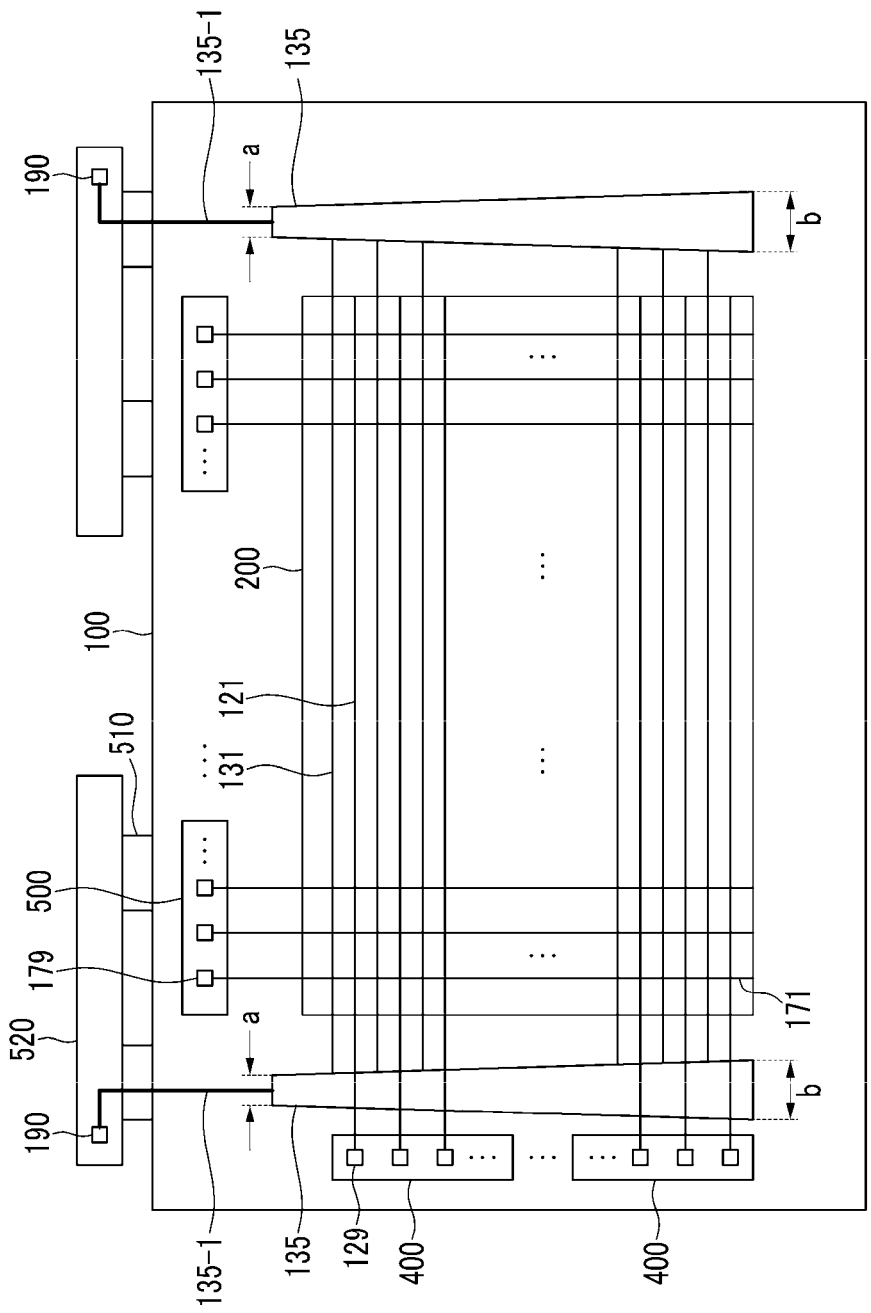
FIG. 24 is a schematic view of a liquid crystal display according to another exemplary embodiment of the present invention.
Figure 25:
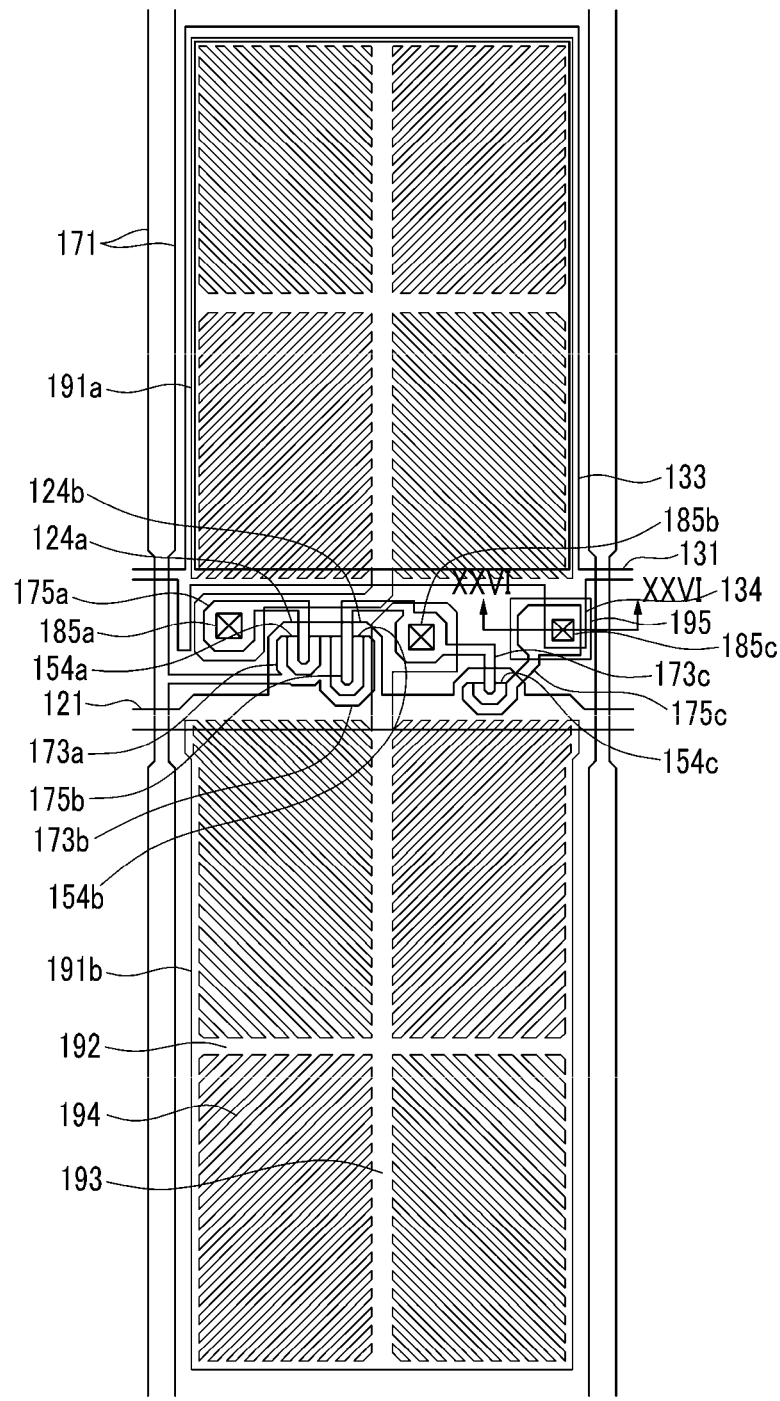
FIG. 25 is a layout view of one pixel of the liquid crystal display of FIG. 24.
Figure 26:
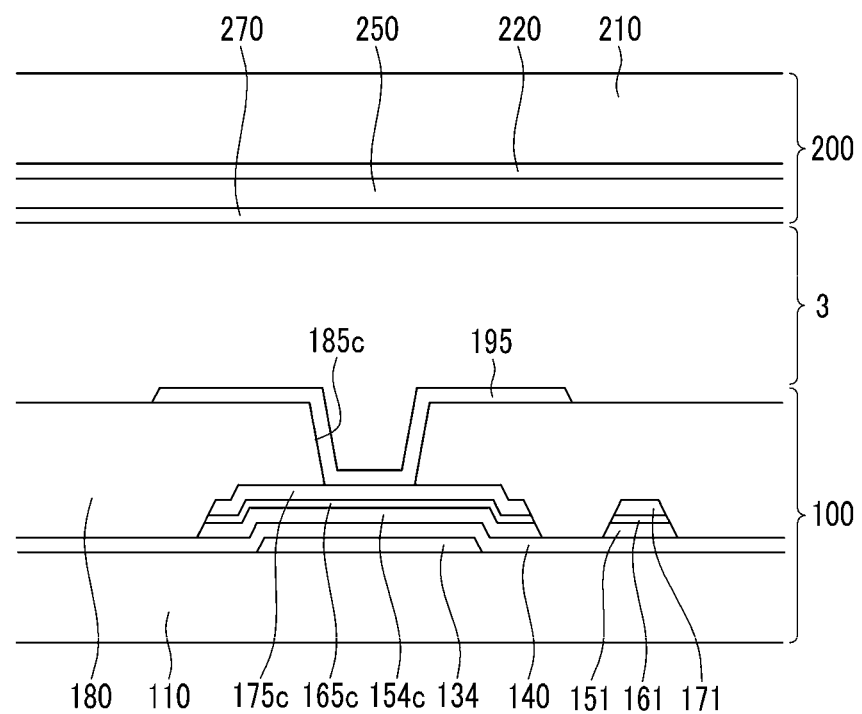
FIG. 26 is a cross-sectional view taken along the line XXVI-XXVI of FIG. 25.

FIG. 24 is a schematic view of a liquid crystal display according to another exemplary embodiment of the present invention, FIG. 25 is a layout view of one pixel of the liquid crystal display of FIG. 24, and FIG. 26 is a cross-sectional view taken along the line XXVI-XXVI of FIG. 25.

Referring to FIG. 24 to FIG. 26, the liquid crystal display according to the present exemplary embodiment is similar to the liquid crystal display according to the exemplary embodiment shown in FIG. 18 to FIG. 21. The description of similar portions is omitted.

In the liquid crystal display according to the present exemplary embodiment, differently from the liquid crystal display according to the exemplary embodiment shown in FIG. 18 to FIG. 21, the storage voltage bar 135 is formed with a trapezoidal shape, the assistant storage voltage line 137 is not formed, and an auxiliary electrode 195 connected to the third drain electrode 175c through the third contact hole 185c is formed.

The auxiliary electrode 195 is formed on the passivation layer 180 and is formed with the same layer as the pixel electrode 191.

The width a at the end of the storage voltage bar 135 connected to the first signal line 135-1 is narrower than the width b at the other end. The width a of the end of the storage voltage bar 135 that is connected to the first signal line 135-1 is more than 10 μm and less than 1000 μm, and the width b of the end facing thereto is larger than the width a and less than four times the width a. Preferably, the width a at the end of the storage voltage bar 135 that is connected to the first signal line 135-1 is more than 50 μm and less than 300 μm, and the width b at the other end is larger than the width a but less than 4a. The width of the storage voltage bar 135 is gradually widened from the end that is connected to the first signal line 135-1 closer to the opposite end.

Therefore, the resistance of the main storage electrode line 131 is gradually increased from the end that is connected to the first signal line 135-1 of the main storage electrode line 131 as it approaches the other end. However, as described above, the width of the storage voltage bar 135 is gradually widened from the end that is connected to the first signal line 135-1 as it approaches the opposite end, and thereby the resistance of the main storage electrode line 131 may be decreased. Accordingly, the change of the storage voltage may be prevented inside the liquid crystal display.

Hereinafter, referring to FIG. 27, a liquid crystal display according to another exemplary embodiment of the present invention will be described.

Figure 27:
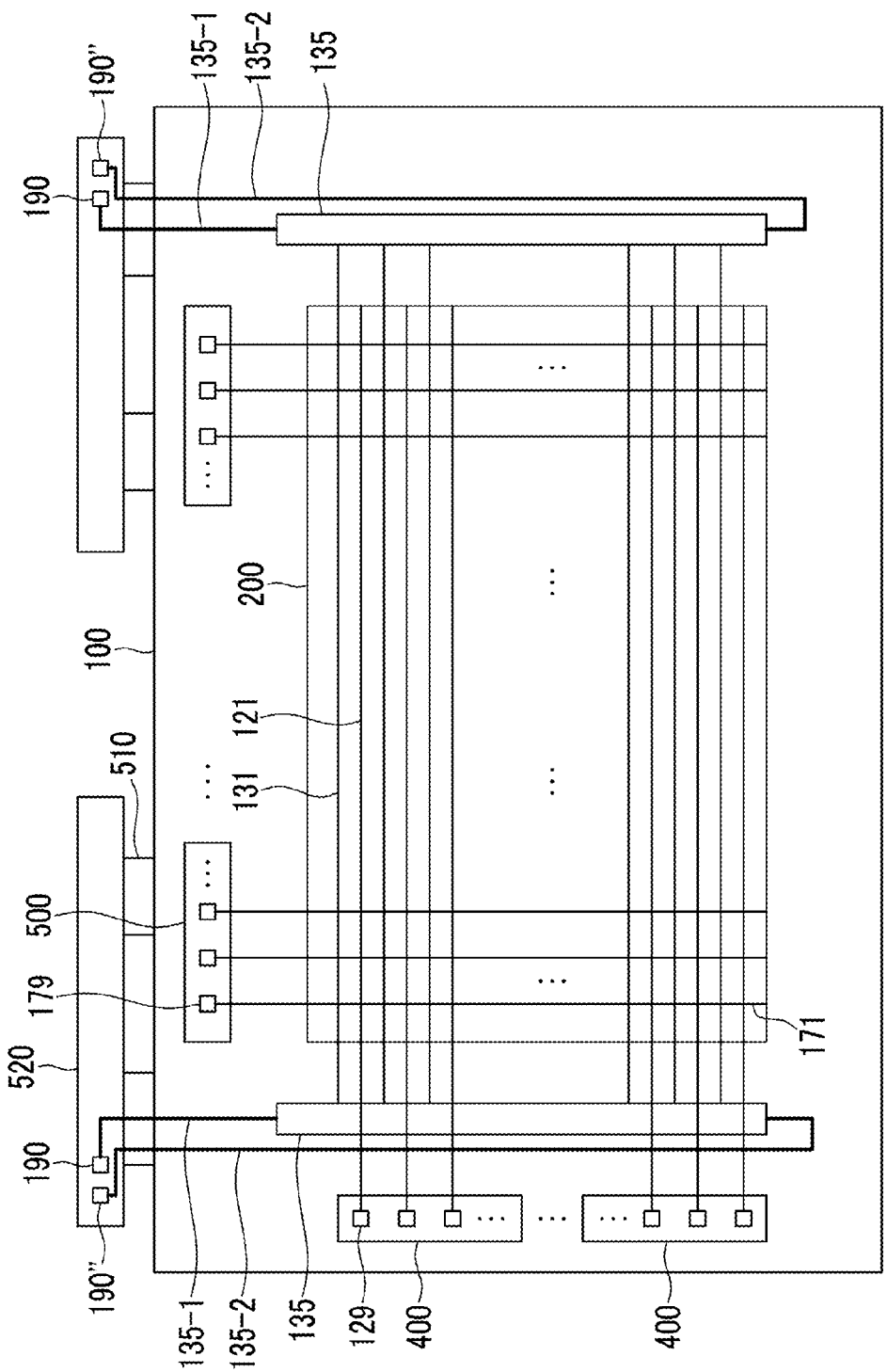
FIG. 27 is a schematic view of a liquid crystal display according to another exemplary embodiment of the present invention.

FIG. 27 is a view of a liquid crystal display according to another exemplary embodiment of the present invention.

Referring to FIG. 27, the liquid crystal display according to the present exemplary embodiment is similar to the liquid crystal display according to the exemplary embodiment shown in FIG. 18 to FIG. 21. Repetitive descriptions of similar portions are omitted.

In the liquid crystal display according to the present exemplary embodiment, which is different from the liquid crystal display according to the exemplary embodiment shown in FIG. 18 to FIG. 21, the assistant storage voltage line 137 is not formed, and the storage voltage bar 135 is supplied with two kinds of storage voltage.

The first voltage pad 190 and a second voltage pad 190" are formed in the printed circuit board (PCB) 520. The first voltage pad 190 is connected to the storage voltage bar 135 through the first signal line 135-1, and the second voltage pad 190" is connected to the storage voltage bar 135 through the second signal line 135-2 (referred to as a storage voltage transmitting line, or the second storage voltage transmitting line to distinguish from 135-1).

The first signal line 135-1 and the second signal line 135-2 are connected to first and second ends of the storage voltage bar 135, respectively. The storage voltage bar 135 receives the first storage voltage through the first signal line 135-1 and the second storage voltage through the second signal line 135-2.

The magnitude of the first storage voltage is larger than 1 V and less than 20 V, and the magnitude of the second storage voltage is equal to or larger than the magnitude of the first storage voltage but not by more than 5 V. Preferably, the magnitude of the first storage voltage is larger than 7 V and less than 15 V, and the magnitude of the second storage voltage is equal to or larger than the magnitude of the first storage voltage but not by more than 2 V.

Also, the magnitude of the first storage voltage may be equal to the magnitude of the second storage voltage.

As described above, the second end of the storage voltage bar 135 is applied with the second storage voltage that is equal to or larger than the magnitude of the first storage voltage such that the change of the storage voltage may be prevented inside the liquid crystal display.

Figure 28:
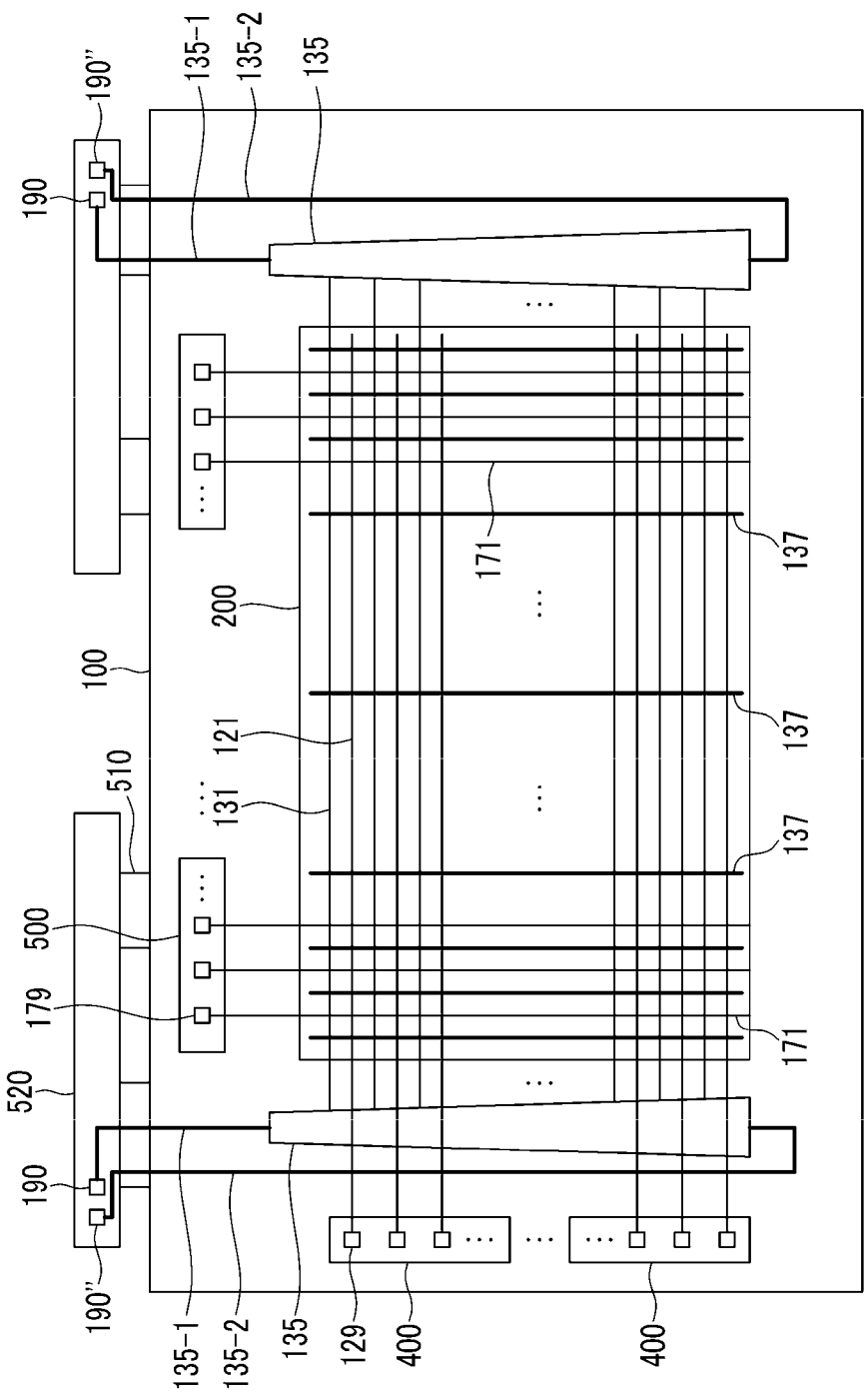
FIG. 28 is a schematic view of a liquid crystal display according to another exemplary embodiment of the present invention.

On the other hand, the above-described exemplary embodiments may be combined, as described in FIG. 28.

FIG. 28 is a view of a liquid crystal display according to another exemplary embodiment according to the present invention.

Referring to FIG. 28, the liquid crystal display according to the present exemplary embodiment includes a combination of elements of the liquid crystal display from the embodiments of FIG. 18, FIG. 24, and FIG. 27.

The assistant storage voltage line 137 is formed on each data line 171 such that the number of assistant storage voltage lines 137 is the same as the number of data lines 171. Each assistant storage voltage line 137 is connected to the main storage electrode line 131, dispersing the storage voltage.

The storage voltage bar 135 has a trapezoidal shape, and the width a of the first end of the storage voltage bar 135 that is connected to the first signal line 135-1 is narrower than the width b of the second end. The width of the storage voltage bar 135 is gradually widened from the first end as it approaches the second end-.

The storage voltage bar 135 is applied with the second storage voltage that is equal to or larger than the magnitude of the first storage voltage. The first voltage pad 190 and the second voltage pad 190" are formed in the printed circuit board (PCB) 520. The first voltage pad 190 is connected to the storage voltage bar 135 through the first signal line 135-1, and the second voltage pad 190" is connected to the storage voltage bar 135 through the second signal line 135-2.

The first end of the storage voltage bar 135 that is connected to the first signal line 135-1 is at the opposite end of the second end of the storage voltage bar 135 that is connected to the second signal line 135-2. The storage voltage bar 135 receives the first storage voltage through the first signal line 135-1 and the second storage voltage through the second signal line 135-2.

As described above, by the combination of the elements of the liquid crystal display shown in FIG. 18, FIG. 24, and FIG. 27, changes of the storage voltage inside the liquid crystal display may be avoided.

In the present exemplary embodiment, a liquid crystal display including the combination of the elements of the liquid crystal display shown in the embodiments of FIG. 18, FIG. 24, and FIG. 27 is described. Elements of a liquid crystal display from other exemplary embodiments may also be combined.

Next, referring to Table 4 and Table 5, the liquid crystal display including the combination of elements from the liquid crystal displays shown in FIG. 18 and FIG. 22 and a conventional structure, that is, the liquid crystal display in which only the storage voltage bar of the rectangular shape and the main storage electrode line connecting the storage voltage bar are formed and the storage voltage bar is applied with one storage voltage, is described.

Table 4 shows data for transmittance dispersion of the conventional structure and a combination of elements from the liquid crystal display of FIG. 18 and FIG. 22.

A standard deviation of the transmittance of nine points of a panel according to Comparative Example 1, Comparative Example 2, and Comparative Example 3 of the conventional structure and Comparative Example 1, Comparative Example 2, and Comparative Example 3 of the combination of elements from the liquid crystal display of FIG. 18 and FIG. 22 is shown.

In case elements from the liquid crystal display of FIG. 18 and FIG. 22 are combined, an average of the transmittance dispersion of the Comparative Examples is 0.07%. For a conventional structure, the average of the transmittance dispersion of Comparative Examples is 0.19%. The combination of elements from the liquid crystal display of FIG. 18 and FIG. 22 has the high transmittance compared with the conventional structure.

TABLE 1

| Conventional structure | | Combination of constitutions of liquid crystal displays according to FIG. 18 and FIG. 22 | |
|---|---|---|---|
| Comparative Example 1 | 0.18% | Comparative Example 1 | 0.09% |
| Comparative Example 2 | 0.21% | Comparative Example 2 | 0.05% |
| Comparative Example 3 | 0.17% | Comparative Example 3 | 0.07% |

Table 5 shows data for a storage voltage drops in a conventional structure and a structure that combines elements from the liquid crystal display of FIG. 18 and FIG. 22. The storage voltage drop is divided into a horizontal direction and a vertical direction. A left upper portion and a middle upper portion of each panel are measured in the horizontal direction, and a left upper portion and a left lower portion of each panel are measured in the vertical direction.

In the structure that combines elements from the liquid crystal display of FIG. 18 and FIG. 22, a storage voltage drop is 0.6 V in the horizontal direction of the panel and the vertical direction of the panel. In the conventional structure, the storage voltage drop is 3 V in the horizontal direction of the panel and the storage voltage drop is 0.8 V in the vertical direction of the panel.

In summary, the structure that has a combination of elements from the liquid crystal display of FIG. 18 and FIG. 22 has a smaller storage voltage drop compared with the conventional structure.

TABLE 5

| Storage voltage drop | Conventional structure | Structure that combines elements from liquid crystal displays according to FIG. 18 and FIG. 22 |
|---|---|---|
| Panel horizontal direction | 3 V | 0.6 V |

TABLE 5-continued

| Storage voltage drop | Conventional structure | Structure that combines elements from liquid crystal displays according to FIG. 18 and FIG. 22 |
|---|---|---|
| Panel vertical direction | 0.8 V | 0.6 V |

In the above, storage voltage and storage voltage line are used, but this is not a limitation of the invention and any voltage commonly applied to a plurality of pixels (or all pixels) in the display area through the wiring may be used. Various voltages including but not limited to the common voltage, the reference voltage, and the driving voltage may be used. In one example, the driving voltage is applied to the driving transistor connected to the organic light emitting element in the pixel of the organic light emitting device. In this specification, although a wiring may be referred to as the main storage voltage line or the assistant storage voltage line (or the shielding electrode line), the transmitted voltage may not be the storage voltage and hence the wiring may be called the first wiring and the second wiring. The voltage that is commonly applied to each pixel may be called the first voltage.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A display device comprising:
   a plurality of gate lines;
   a plurality of data lines;
   a plurality of first wires extending in a direction of the gate lines;
   a plurality of second wires extending in a direction of the data lines; and
   a plurality of pixels,
   wherein one pixel comprises a first subpixel having a first subpixel electrode and a first switching element and a second subpixel having a second subpixel electrode, a second switching element, and a third switching element,
   the first switching element comprises a first control terminal connected to one of the plurality of gate lines, a first input terminal connected to one of the plurality of data lines, and a first output terminal connected to the first subpixel electrode,
   the second switching element comprises a second control terminal connected to the same gate line as the first switching element, a second input terminal connected to the same data line as the first switching element, and a second output terminal connected to the second subpixel electrode,
   the third switching element comprises a third control terminal connected to the same gate line as the first switching element, a third input terminal connected to the second output terminal of the second switching element, and a third output terminal connected to one of the plurality of second wires, and
   the plurality of first wires and the plurality of second wires are electrically connected to each other in at least one of the plurality of pixels.

2. The display device of claim 1, wherein
one of the plurality of first wires and one of the plurality of second wires are electrically connected to each other at a protrusion of the first wires.

3. The display device of claim 1, wherein
the first wire is a main storage voltage line, the second wire is an assistant storage voltage line, and the first wire and the second wire are supplied with a storage voltage.

4. The display device of claim 3, wherein
a plurality of main storage voltage lines are connected by a pair of storage voltage bars, and
a plurality of assistant storage voltage lines are connected by at least one assistant storage voltage bar.

5. The display device of claim 4, wherein
a pair of storage voltage bars are positioned at respective ends of the plurality of main storage voltage lines, and
at least one assistant storage voltage bar is connected to a plurality of assistant storage voltage lines of a portion formed at a left side, while one of the assistant storage voltage bar is connected to a plurality of assistant storage voltage lines formed at a right side.

6. The display device of claim 5, wherein
a main storage voltage line is connected to a first storage electrode and a second storage electrode that form the assistant storage voltage line, and
a protrusion of the first storage electrode and a protrusion of the second storage electrode are connected by a storage electrode connecting member.

7. The display device of claim 6, wherein:
the first storage electrode is formed in the first subpixel;
the second storage electrode is formed in the second subpixel;
the main storage voltage line is connected directly to the first storage electrode; and
the second storage electrode is connected to the main storage voltage line through the storage electrode connecting member or the first storage electrode.

8. The display device of claim 6, wherein:
the storage electrode connecting member is formed in one of a plurality of neighboring pixels.

9. The display device of claim 4, wherein
the pair of storage voltage bars and the at least one assistant storage voltage bar receive the storage voltage from a pad portion of a data driver.

10. The display device of claim 9, wherein
the pad portion of the data driver applying the storage voltage to the pair of storage voltage bars and the at least one assistant storage voltage bar comprises two pad portions formed at a leftmost side and two pad portions formed at a rightmost side.

11. The display device of claim 3, wherein
a plurality of the second wires overlap the pixel electrode.

12. The display device of claim 11, wherein
the first subpixel electrode and the second subpixel electrode respectively comprise a transverse stem, a longitudinal stem, and minute branches,
the assistant storage voltage line comprises a portion formed according to the longitudinal stem.

13. The display device of claim 12, wherein
assistant storage voltage lines comprise a first assistant storage voltage line and a second assistant storage voltage line,
the first assistant storage voltage line comprises a portion overlapping the longitudinal stem of the first subpixel electrode and a portion extending toward a protrusion of the main storage voltage line, and the second assistant storage voltage line comprises a portion overlapping the longitudinal stem of the second subpixel electrode and a portion connected to the third switching element.

14. The display device of claim 13, wherein
at least one of the first assistant storage voltage line and the second assistant storage voltage line comprises a portion overlapping the transverse stem.

15. The display device of claim 13, wherein
the second assistant storage voltage line is connected to a third drain electrode of the third switching element.

16. The display device of claim 15, wherein
the second assistant storage voltage line and the third drain electrode extend to the protrusion of the main storage voltage line, and
the first assistant storage voltage line, the second assistant storage voltage line, and the main storage voltage line are electrically connected to each other at the protrusion of the main storage voltage line.

17. The display device of claim 16, wherein
the first assistant storage voltage line and the second assistant storage voltage line are directly connected at the protrusion of the main storage voltage line and formed with the same material.

18. The display device of claim 12, further comprising
a shielding electrode line formed according to the data line.

19. The display device of claim 18, wherein
one pixel comprises a transistor region between the first subpixel and the second subpixel, and
the shielding electrode line comprises a first portion extending toward the transistor region, an extension extending from the first portion without overlapping with the data line, and a connection curved toward the data line.

20. The display device of claim 19, wherein
the first portion is electrically connected to the main storage voltage line through a contact hole.

21. The display device of claim 12, wherein
assistant storage voltage lines are divided into a first assistant storage voltage line and a second assistant storage voltage line, and the first assistant storage voltage line and the second assistant storage voltage line are connected by a storage electrode connecting member.

22. The display device of claim 1, wherein
the second wire is a shielding electrode line overlapping the data line and extending in the direction of the data line, and
the shielding electrode line comprises a first portion that expands while bending in the transistor region, an extension extending from the first portion without overlapping with the data line, and a connection curving toward the data line.

23. A display device comprising:
a first substrate including a display area and a peripheral area enclosing the display area;
two storage voltage bars respectively positioned in the peripheral area at both sides of the display area;
a plurality of gate lines formed on the first substrate;
a plurality of main storage electrode lines positioned on the first substrate and connected to the two storage voltage bars;
a plurality of data lines positioned on the first substrate and intersecting the gate lines;
a plurality of pixels connected to the plurality of gate lines and the plurality of data lines; and
an assistant storage voltage line electrically connected to the main storage electrode line,
wherein each pixel comprises
a first thin film transistor and a second thin film transistor connected to a gate line and a data line,
a third thin film transistor connected to a gate line, a second thin film transistor, and a main storage electrode line, and
a pixel electrode including a first subpixel electrode connected to the first thin film transistor and a second subpixel electrode connected to the second thin film transistor.

24. The display device of claim 23, wherein
the assistant storage voltage line is formed in plural and is connected to the main storage electrode line through a third thin film transistor in each pixel.

25. The display device of claim 24, wherein
each assistant storage voltage line is positioned on a data line.

26. The display device of claim 25, further comprising
a storage voltage transmitting line positioned in the peripheral area and applying a storage voltage to the storage voltage bar,
wherein the width of the storage voltage bar is gradually increased in going from a first end connected to the storage voltage transmitting line to a second end that is connected to the storage voltage transmitting line.

27. The display device of claim 26, wherein
the storage voltage bar is applied with a first storage voltage and a second storage voltage that is equal to or larger than the first storage voltage.

28. The display device of claim 25, wherein:
the storage voltage bar is applied with a first storage voltage and a second storage voltage that is equal to or larger than the first storage voltage.

29. The display device of claim 23, further comprising
multiple assistant storage voltage lines that are positioned at ¼, ½, and ¾ of a distance between the two storage voltage bars.

30. The display device of claim 29, wherein
the assistant storage voltage line is positioned on the data line.

31. The display device of claim 30, wherein
the magnitude of the voltage applied to the assistant storage voltage line is equal to or larger than the magnitude of the voltage applied to the main storage electrode line.

32. The display device of claim 31, further comprising
a storage voltage transmitting line positioned in the peripheral area and applying the storage voltage to the storage voltage bar,
wherein the width of the storage voltage bar is gradually increased in going from a first end connected to the storage voltage transmitting line to a second end connected to the storage voltage transmitting line.

33. The display device of claim 32, wherein
the storage voltage bar is applied with a first storage voltage and a second storage voltage that is equal to or larger than the first storage voltage.

34. The display device of claim 31, wherein
the storage voltage bar is applied with a first storage voltage and a second storage voltage that is equal to or larger than the first storage voltage.

35. The display device of claim 23, wherein
the assistant storage voltage line is positioned about halfway between two storage voltage bars.

36. The display device of claim 35, wherein
the assistant storage voltage line is positioned on the data line.

37. The display device of claim 36, wherein
the magnitude of the voltage applied to the assistant storage voltage line is equal to or larger than the magnitude of the voltage applied to the main storage electrode line.

38. The display device of claim 37, further comprising
a storage voltage transmitting line positioned in the peripheral area and applying a storage voltage to a storage voltage bar,
wherein the width of the storage voltage bar increases in going from a first end connected to the storage voltage transmitting line to a second end connected to the storage voltage transmitting line.

39. The display device of claim 38, wherein
the storage voltage bar is applied with a first storage voltage and a second storage voltage that is equal to or larger than the first storage voltage.

40. The display device of claim 37, wherein
a storage voltage bar is applied with a first storage voltage and a second storage voltage that is equal to or larger than the first storage voltage.

41. The display device of claim 23, wherein
the main storage electrode line comprises a protrusion overlapping one terminal of the third thin film transistor, and
the assistant storage voltage line comprises a connecting member extending toward the protrusion of the main storage electrode line.

42. The display device of claim 41, wherein
the connecting member is connected to one terminal of the third thin film transistor.

43. The liquid crystal display of claim 42, wherein
the assistant storage voltage line is formed with the same layer as the first subpixel electrode and the second subpixel electrode.

44. The display device of claim 23, wherein
the output terminal of the second thin film transistor is connected to the second subpixel electrode and the input terminal of the third thin film transistor.

45. The display device of claim 44, wherein
the voltage applied to the second subpixel electrode is lower than the voltage applied to the first subpixel electrode.

46. The display device of claim 45, wherein
the area of the second subpixel electrode is equal to or larger than the area of the first subpixel electrode.

47. The display device of claim 46, wherein
the first subpixel electrode and the second subpixel electrode comprise a cross stem including a transverse stem and a longitudinal stem intersecting thereto, and
a plurality of minute branches extending from the cross stem.

48. The display device of claim 23, wherein
the gate line transmits a gate signal, and the gate signal applied to each control terminal of the first thin film transistor, the second thin film transistor, and the third thin film transistor is simultaneously transmitted.

49. A display device comprising:
a first substrate including a display area and a peripheral area enclosing the display area;
two storage voltage bars respectively positioned in the peripheral area at two sides of the display area;
a gate line positioned on the first substrate;
a main storage electrode line positioned on the first substrate and connected to the two storage voltage bars;
a data line positioned on the first substrate and intersecting the gate line;
a first thin film transistor and a second thin film transistor connected to the gate line and the data line;
a third thin film transistor connected to the gate line, the second thin film transistor, and the main storage electrode line;
a pixel electrode including a first subpixel electrode connected to the first thin film transistor and a second subpixel electrode connected to the second thin film transistor; and
a storage voltage transmitting line positioned in the peripheral area and applying the storage voltage to the storage voltage bar,
wherein the width of the storage voltage bar increases in going from a first end connected to the storage voltage transmitting line to a second end connected to the storage voltage transmitting line.

50. The liquid crystal display of claim 49, wherein
the output terminal of the second thin film transistor is connected to the second subpixel electrode and the input terminal of the third thin film transistor.

51. The display device of claim 50, wherein
the voltage applied to the second subpixel electrode is lower than the voltage applied to the first subpixel electrode.

52. The display device of claim 51, wherein
the area of the second subpixel electrode is equal to or larger than the area of the first subpixel electrode.

53. The display device of claim 52, wherein
the first subpixel electrode and the second subpixel electrode comprise a cross stem including a transverse stem and a longitudinal stem intersecting thereto, and
a plurality of minute branches extending from the cross stem.

54. The display device of claim 49, wherein
the gate line transmits a gate signal, and the gate signal applied to each control terminal of the first thin film transistor, the second thin film transistor, and the third thin film transistor is simultaneously transmitted.

55. A display device comprising:
a first substrate including a display area and a peripheral area enclosing the display area;
two storage voltage bars respectively positioned in the peripheral area at two sides of the display area;
a gate line positioned on the first substrate;
a main storage electrode lines positioned on the first substrate and connected to the two storage voltage bars;
a data line positioned on the first substrate and intersecting the gate line;
a first thin film transistor and a second thin film transistor connected to the gate line and the data line;
a third thin film transistor connected to the gate line, the second thin film transistor, and the main storage electrode line; and
a pixel electrode including a first subpixel electrode connected to the first thin film transistor and a second subpixel electrode connected to the second thin film transistor,
wherein the two storage voltage bars are applied with a first storage voltage and a second storage voltage, respectively.

56. The display device of claim 55, wherein
the magnitude of the second storage voltage is equal to or larger than the magnitude of the first storage voltage.

57. The display device of claim 56, further comprising:
a first storage voltage transmitting line applying the first storage voltage to the two storage voltage bar; and a second storage voltage transmitting line applying the second storage voltage to the two storage voltage bar.

58. The display device of claim 57, wherein
the storage voltage bar comprises a first end that is connected to the first storage voltage transmitting line and a second end that is connected to the second storage voltage transmitting line.

59. The display device of claim 55, wherein
the output terminal of the second thin film transistor is connected to the second subpixel electrode and the input terminal of the third thin film transistor.

60. The display device of claim 59, wherein
the voltage applied to the second subpixel electrode is lower than the voltage applied to the first subpixel electrode.

61. The display device of claim 60, wherein
the area of the second subpixel electrode is equal to or larger than the area of the first subpixel electrode.

62. The display device of claim 61, wherein
the first subpixel electrode and the second subpixel electrode comprise a cross stem including a transverse stem and a longitudinal stem intersecting thereto, and
a plurality of minute branches extending from the cross stem.

63. The display device of claim 55, wherein
the gate line transmits a gate signal, and the gate signal applied to each control terminal of the first thin film transistor, the second thin film transistor, and the third thin film transistor is simultaneously transmitted.

\* \* \* \* \*